(12) United States Patent
Kim et al.

(10) Patent No.: US 11,057,017 B2
(45) Date of Patent: Jul. 6, 2021

(54) BULK-ACOUSTIC WAVE RESONATOR

(71) Applicant: Samsung Electro-Mechanics Co., Ltd., Suwon-si (KR)

(72) Inventors: Tae Yoon Kim, Suwon-si (KR); Won Han, Suwon-si (KR); Chang Hyun Lim, Suwon-si (KR)

(73) Assignee: Samsung Electro-Mechanics Co., Ltd, Suwon-si (KR)

( * ) Notice: Subject to any disclaimer, the term of this patent is extended or adjusted under 35 U.S.C. 154(b) by 610 days.

(21) Appl. No.: 15/996,921

(22) Filed: Jun. 4, 2018

(65) Prior Publication Data

US 2019/0058455 A1 Feb. 21, 2019

(30) Foreign Application Priority Data

Aug. 17, 2017 (KR) .................. 10-2017-0104415
Jan. 31, 2018 (KR) .................. 10-2018-0012038

(51) Int. Cl.
*H03H 9/17* (2006.01)
*H03H 3/02* (2006.01)
*H03H 9/05* (2006.01)
*H03H 9/02* (2006.01)

(52) U.S. Cl.
CPC .............. *H03H 9/177* (2013.01); *H03H 3/02* (2013.01); *H03H 9/02118* (2013.01); *H03H 9/0514* (2013.01); *H03H 9/173* (2013.01); *H03H 9/174* (2013.01); *H03H 2003/021* (2013.01); *H03H 2003/023* (2013.01)

(58) Field of Classification Search
CPC .... H03H 9/177; H03H 9/02118; H03H 9/173; H03H 9/174; H03H 2003/021
See application file for complete search history.

(56) References Cited

U.S. PATENT DOCUMENTS

| | | | |
|---|---|---|---|
| 7,280,007 B2 | 10/2007 | Feng et al. | |
| 7,567,023 B2 | 7/2009 | Iwaki et al. | |
| 8,902,023 B2 | 12/2014 | Choy et al. | |
| 2007/0080611 A1* | 4/2007 | Yamada | H01L 41/0477 310/364 |
| 2011/0084779 A1* | 4/2011 | Zhang | H03H 9/584 333/187 |
| 2014/0176261 A1* | 6/2014 | Burak | H03H 9/02086 333/187 |
| 2017/0207768 A1* | 7/2017 | Liu | H03H 9/02015 |
| 2017/0244379 A1* | 8/2017 | Yang | H03H 9/1014 |

FOREIGN PATENT DOCUMENTS

| | | |
|---|---|---|
| JP | 2006-50021 A | 2/2006 |
| JP | 4756461 B2 | 8/2011 |

* cited by examiner

*Primary Examiner* — Bryan P Gordon
(74) *Attorney, Agent, or Firm* — NSIP Law

(57) ABSTRACT

A bulk-acoustic wave resonator includes a substrate; a lower electrode formed on the substrate, and at least a portion of the lower electrode is formed on a cavity; a piezoelectric layer formed on the lower electrode; an upper electrode formed on the piezoelectric layer; a membrane layer formed below the lower electrode and forming the cavity together with the substrate; and a protruding portion formed on the membrane layer and further formed in the cavity in a direction that extends away from the membrane layer.

21 Claims, 20 Drawing Sheets

BULK-ACOUSTIC WAVE RESONATOR

CROSS-REFERENCE TO RELATED APPLICATIONS

This application claims the benefit under 35 USC 119(a) of Korean Patent Application No. 10-2017-0104415 filed on Aug. 17, 2017 and Korean Patent Application No. 10-2018-0012038 filed on Jan. 31, 2018 in the Korean Intellectual Property Office, the disclosures of which are incorporated herein by reference for all purposes.

BACKGROUND

1. Field

The present disclosure relates to a bulk-acoustic wave resonator.

2. Description of Related Art

A bulk-acoustic wave resonator (BAW) generally includes a lower electrode, a piezoelectric layer, and an upper electrode and operates in a fundamental mode by vibrations propagated in a vertical direction by deformation of the piezoelectric layer. However, the bulk-acoustic wave resonator also generates vibrations of a lateral mode which are propagated in a horizontal direction.

In this case, lateral waves may leak externally from an end of the resonator, such that mechanical quality (Q) performance may be decreased. The typical bulk-acoustic wave resonator uses a structure in which a frame is formed on the upper electrode to reflect the lateral waves into the inside of the resonator, thereby trapping resonance energy in an active area.

However, there is a problem in that resonance due to the frame may unintentionally occur in a frequency domain lower than a resonance frequency of the active area of the resonator to thereby cause interference in a waveform of an adjacent filter band.

Additionally, since an area of the active area of the resonator becomes narrow by the frame, there is a limitation in which some characteristics (e.g., $Kt^2$ characteristics) are decreased as an area of an inner region of the frame is increased to suppress a decrease in Q performance and attenuation performance. Further, there is a problem in that spurious noise may be increased by a structure of the frame.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes a substrate; a lower electrode formed on the substrate, and at least a portion of the lower electrode is formed on a cavity; a piezoelectric layer formed on the lower electrode; an upper electrode formed on the piezoelectric layer; a membrane layer formed below the lower electrode and forming the cavity together with the substrate; and a protruding portion formed on the membrane layer and further formed in the cavity in a direction that extends away from the membrane layer.

The protruding portion includes a first protruding part formed below a first edge of the upper electrode and a second protruding part formed below a first edge of the lower electrode.

The first protruding part includes a first inclined part inclined to be spaced apart from the lower electrode and a first extended part formed to be parallel to a central portion of the membrane layer and extending from the first inclined part, and the second protruding part includes a second inclined part inclined to be spaced apart from the lower electrode and a second extended part formed to be parallel to the central portion of the membrane layer and extending from the second inclined part.

A thickness of at least one of the first inclined part and the second inclined part, and the first extended part and the second extended part is thicker than a thickness of the central portion of the membrane layer.

The protruding portion includes a first membrane layer and a second membrane layer stacked on the first membrane layer.

The protruding portion is formed by removing a plurality of sacrificial layers.

The first protruding part and the second protruding part have different widths.

The protruding portion is inclined.

The protruding portion is formed below an edge of the upper electrode.

The protruding portion is formed below an edge of the lower electrode.

The lower electrode is formed below the piezoelectric layer, and a side surface of the lower electrode is exposed to the cavity.

The bulk-acoustic wave resonator further includes a passivation layer stacked on the upper electrode and on a first portion of the lower electrode, and a metal pad stacked on the upper electrode and on a second portion of the lower electrode on which the passivation layer is not formed.

According to another general aspect, a bulk-acoustic wave resonator includes a substrate; a seed layer forming a cavity together with the substrate; a lower electrode formed on the substrate, and at least a portion of the lower electrode is formed on the cavity; a piezoelectric layer formed on the lower electrode; an upper electrode formed on the piezoelectric layer; and a protruding portion extended from the seed layer and formed in the cavity to face away from the seed layer.

The protruding portion includes a first protruding part formed below a first edge of the upper electrode and a second protruding part formed below a first edge of the lower electrode, and the first protruding part and the second protruding part include first parts that extend in a vertical direction from the seed layer and second parts that extend in a horizontal direction from the first parts.

According to another general aspect, a bulk-acoustic wave resonator includes a substrate; a lower electrode formed on the substrate; an upper electrode formed on the piezoelectric layer; a membrane layer formed below the lower electrode and configured to form a cavity with the substrate; and a protruding portion formed on one or more ends of the membrane layer.

The protruding portion includes a first protruding part that extends away from a first end of the membrane layer, and a second protruding part that extends away from a second end of the membrane layer.

The first protruding part includes a first extended part that extends away from the membrane layer, and a first horizontal part that extends from the first extended part, and the second protruding part includes a second extended part that extends away from the membrane layer, and a second horizontal part that extends from the second extended part.

The protruding portion is formed outside of an active area of the resonator.

The active area is an area where the lower electrode, the piezoelectric layer and the upper electrode are stacked.

The first protruding part is formed below an edge of the upper electrode, and the second protruding part is formed below an edge of the lower electrode.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
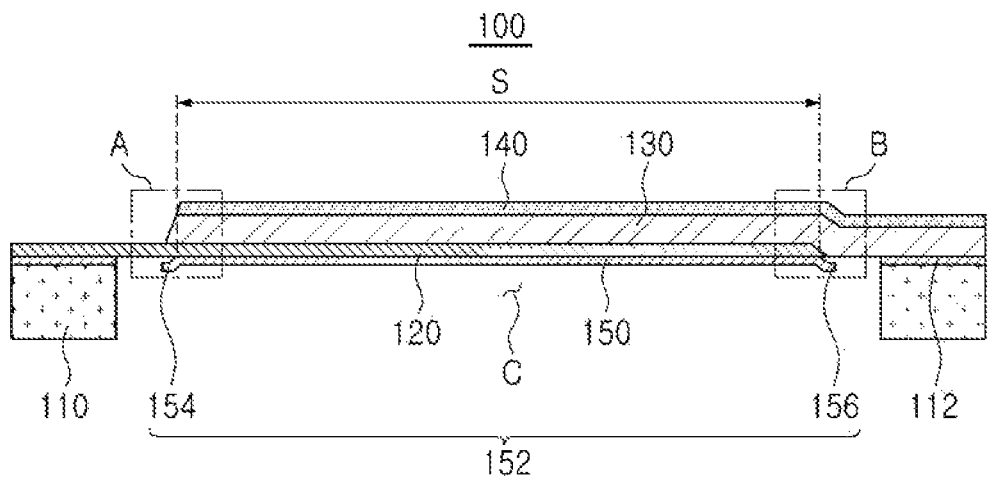
FIG. 1 is a schematic cross-sectional view illustrating an example of a bulk-acoustic wave resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
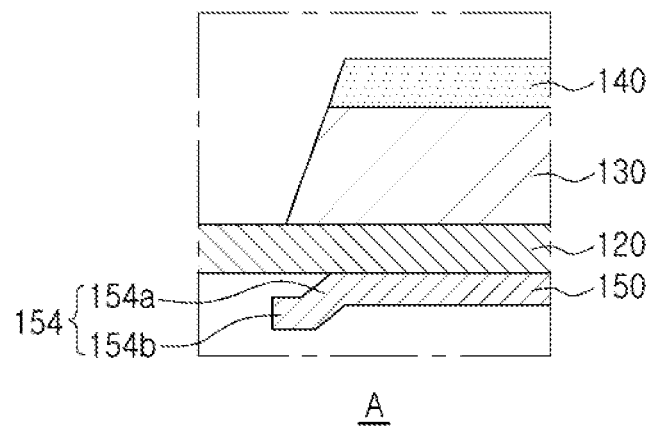
FIG. 2 is an enlarged view illustrating an example of an enlarged view of a portion of a bulk-acoustic wave resonator.
Figure 3:
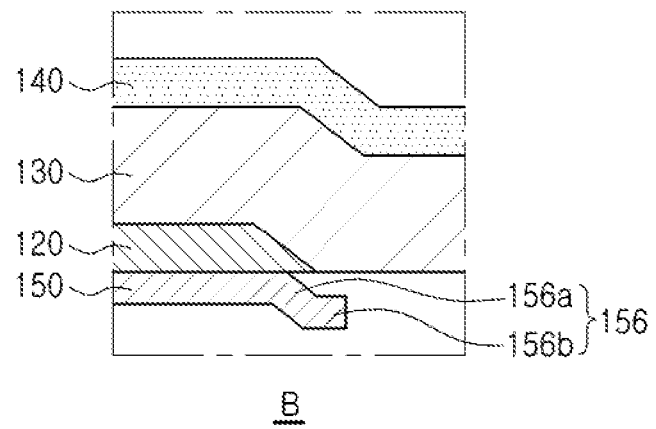
FIG. 3 is an enlarged view illustrating an example of an enlarged view of a bulk-acoustic wave resonator.

FIG. 1 is a schematic cross-sectional view illustrating an example of a bulk-acoustic wave resonator, FIG. 2 is an enlarged view illustrating part A of FIG. 1, and FIG. 3 is an enlarged view illustrating part B of FIG. 1.

Referring to FIGS. 1 through 3, a bulk-acoustic wave resonator 100 according to the present disclosure may include, for example, a substrate 110, a substrate protective layer 112, a lower electrode 120, a piezoelectric layer 130, an upper electrode 140, and a membrane layer 150, for example.

A cavity C may be formed in the substrate 110. As an example, the substrate 110 may be a substrate on which silicon is stacked. For example, a silicon wafer may be used as the substrate. However, a case in which the cavity C is formed in the substrate 110 is described in the drawings as an example, but the cavity C is not limited thereto and may be formed by the substrate 110 of a plate shape and a membrane layer 150. That is, examples of the cavity C may be formed as further illustrated in FIGS. 17 through 23 to be described blow.

The lower electrode 120 may be formed on the substrate 110 and a portion of the lower electrode 120 may be disposed on the cavity C. As an example, the lower electrode 120 may be formed of a conductive material such as molybdenum (Mo), ruthenium (Ru), tungsten (W), iridium (Ir), platinum (Pt), and the like, or an alloy thereof.

Additionally, the lower electrode 120 may be used as any one of an input electrode and an output electrode that inputs and outputs an electrical signal such as a radio frequency (RF) signal or the like.

The piezoelectric layer 130 is formed to at least cover the lower electrode 120 formed on the cavity C. The piezoelectric layer 130 converts the signal input through the lower electrode 120 or the upper electrode 140 into an elastic wave. That is, the piezoelectric layer 130 converts an electrical signal into an elastic wave by physical vibrations.

As an example, the piezoelectric layer 130 may be formed by depositing aluminum nitride, doped aluminum nitride, zinc oxide, or lead zirconate titanate.

Additionally, in a case in which the piezoelectric layer 130 is formed to contain aluminum nitride (AlN), the piezoelectric layer 130 may further include a rare earth metal, such as by being doped by one or more rare earth metals. As non-limiting examples, the rare earth metal may include at least one of scandium (Sc), erbium (Er), yttrium (Y), and lanthanum (La). In addition, in the case in which the piezoelectric layer 130 is formed to contain aluminum nitride (AlN), the piezoelectric layer 130 may similarly further include one or more transition metals. As a non-limiting example, the transition metal may include at least one of zirconium (Zr), titanium (Ti), manganese (Mn), and hafnium (Hf).

The upper electrode 140 may be formed to at least cover the piezoelectric layer 130 disposed on the cavity C. Alternately, the upper electrode 140 may be formed to cover a partial portion of the piezoelectric layer 130. Additionally, the upper electrode 140 is formed of a conductive material such as molybdenum (Mo), ruthenium (Ru), tungsten (W), iridium (Ir), platinum (Pt), but is not limited thereto, or an alloy thereof, similarly to the lower electrode 120.

The upper electrode 140 may be used as any one of an input electrode and an output electrode that inputs and outputs an electrical signal such as a radio frequency (RF) signal, or the like. That is, in a case in which the lower electrode 120 is used as the input electrode, the upper electrode 140 may be used as the output electrode, and in a case in which the lower electrode 120 is used as the output electrode, the upper electrode 140 may be used as the input electrode.

The membrane layer 150 is formed on a bottom surface of the lower electrode 120 so as to be disposed on the cavity C. A protruding portion 152, formed to be spaced apart from the lower electrode 120, is formed at respective edges of the membrane layer 150.

The protruding portion 152 may be formed outside an active area S of the bulk-acoustic wave resonator 100. The active area S refers to an area in which all of the lower electrode 120, the piezoelectric layer 130, and the upper electrode 140 are stacked.

As an example, the protruding portion 152 includes a first protruding part 154 (FIG. 2) formed below an inclined edge of a first end of the upper electrode 140 and a second protruding part 156 formed below an inclined edge of a first end of the lower electrode 120. Additionally, the first protruding part 154 includes a first inclined part 154a inclined to be spaced apart from the lower electrode 120 and a first extended part 154b formed to be parallel to a central portion of the membrane layer 150, and extending from the first inclined part 154a. Additionally, the second protruding part 156 (FIG. 3) includes a second inclined part 156a inclined to be spaced apart from the lower electrode 120 and a second extended part 156b formed to be parallel to the central portion of the membrane layer 150, and extending from the second inclined part 156a.

As such, the membrane layer 150 includes the protruding portion 152, such that resonance energy may be trapped in the active area by reflecting a lateral wave into the resonator even though a frame part is not formed on the upper electrode 140 as in the general technology.

As described above, although a resonance energy trapping/reflecting frame part is not formed in an example, the resonance energy may be trapped in the active area by a reflecting of the lateral wave into the resonator or active area by the protruding portion 152 included in the membrane layer 150, and interference in an adjacent filter band by a resonance of a low frequency domain caused by such a frame part may be reduced by the protruding portion 152 of the membrane layer 150.

Figure 4:
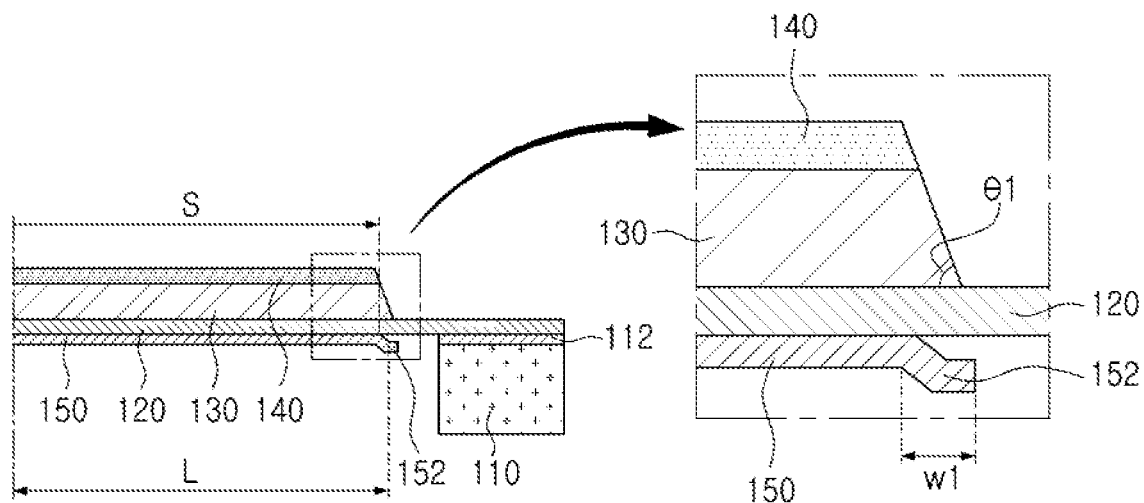
FIG. 4 is a configuration view illustrating an example of an effect of a bulk-acoustic wave resonator.
Figure 5:
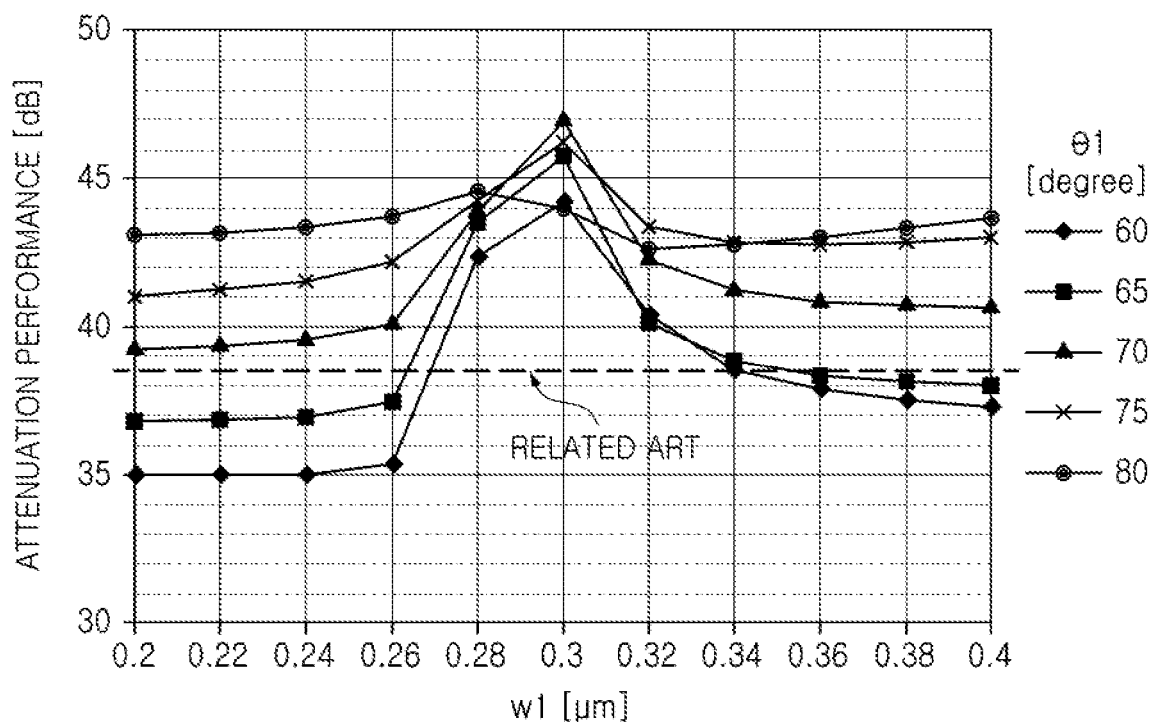
FIGS. 5 and 6 are graphs illustrating an example of a change in attenuation characteristics according to a width of a protruding part of the bulk-acoustic wave resonator.
Figure 6:
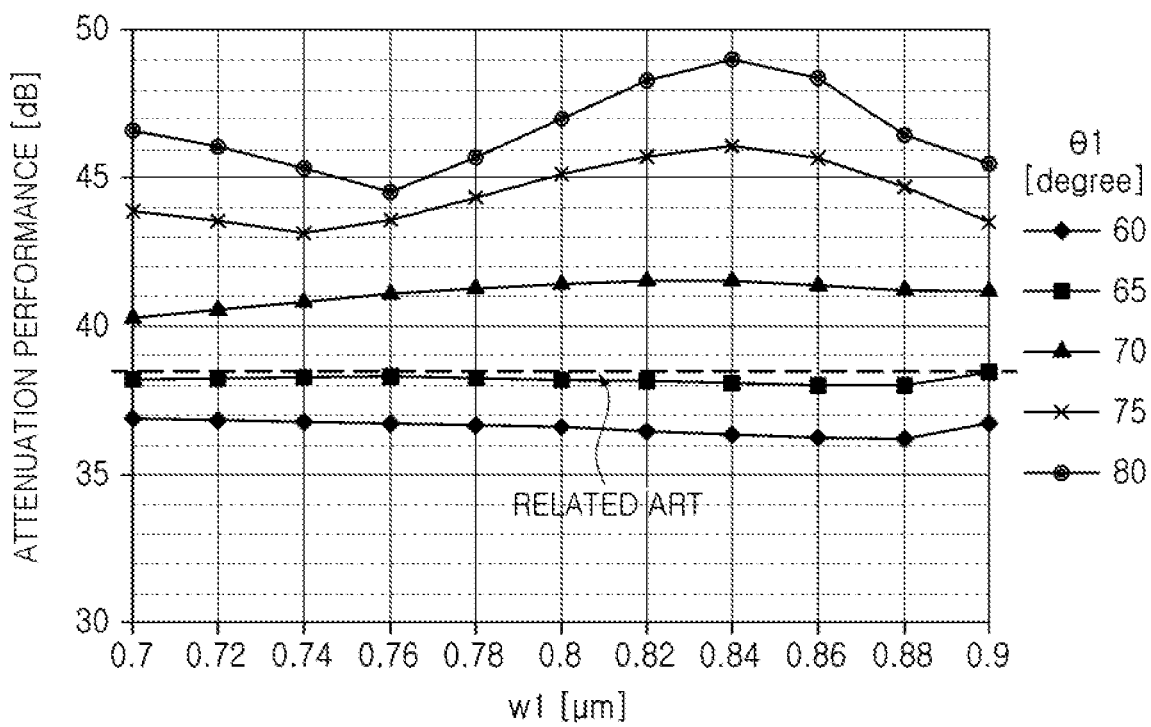
Figure 7:
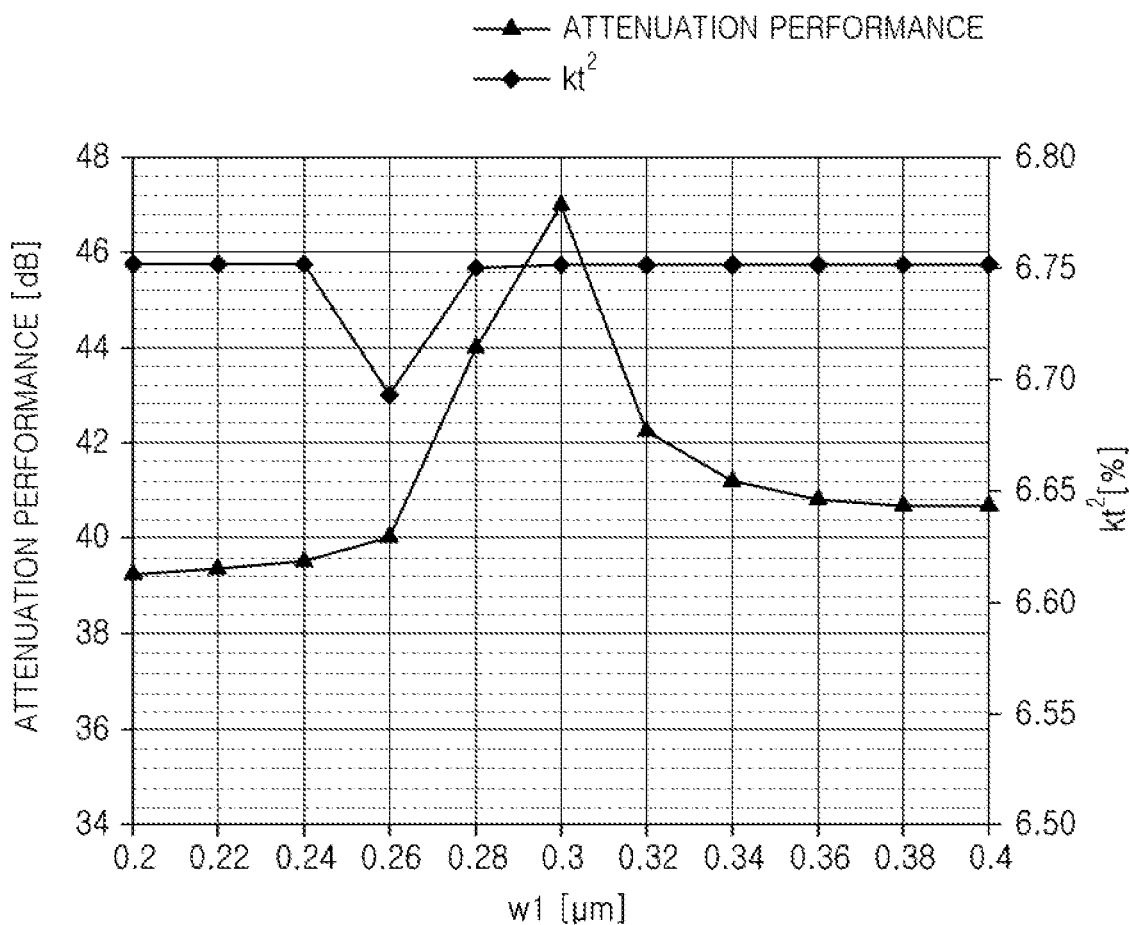
FIG. 7 is a graph illustrating an example of a change in attenuation characteristics and a change in $Kt^2$ characteristics according to the width of the protruding part of a bulk-acoustic wave resonator.

FIG. 4 is a configuration view illustrating an example of an effect of a bulk-acoustic wave resonator of the present disclosure, FIGS. 5 and 6 are graphs illustrating examples of a change in attenuation characteristics according to a width of a protruding part of the bulk-acoustic wave resonator according to the present disclosure, and FIG. 7 is a graph illustrating an example of a change in attenuation characteristics and a change in $Kt^2$ characteristics according to the width of the protruding part of a bulk-acoustic wave resonator according to the present disclosure.

First, referring to FIG. 4, a distance L from a point at the center of the active area S to a point at an end of the active area S may be, for example, about 50 μm, the upper electrode 140 and the lower electrode 120 may be formed of a molybdenum (Mo) material, but is not limited thereto, and a thickness of each of the upper electrode 140 and the lower electrode 120 may be about 0.28 μm. Additionally, the piezoelectric layer 130 may be formed of an aluminum nitride alloy material, but is not limited thereto, and a thickness of the piezoelectric layer 130 may be about 1.1 μm. As an example, the piezoelectric layer 130 may contain scandium (Sc). In addition, the membrane layer 150 may be formed of aluminum nitride (AlN), and a thickness of the membrane layer 150 may be about 0.3 μm.

Here, an angle of inclination of the edge of the piezoelectric layer 130 is θ1, and a width of the protruding portion 152 is w1.

The membrane layer 150 includes the protruding portion 152 and the attenuation performance is thus improved as illustrated in FIG. 5. That is, it may be seen that the attenuation performance is improved in the range in which the width w1 of the protruding portion 152 of the membrane layer 150 is 0.28 μm to 0.32 μm. Additionally, it may be seen that the attenuation performance is improved in a case in which the angle of inclination θ1 of the edge of the piezoelectric layer 130 is greater than 70° as compared to the typical technology (i.e., the case in which the frame part is formed).

Additionally, as illustrated in FIG. 6, the attenuation performance is improved. That is, the attenuation performance is improved in the range in which the width w1 of the protruding portion 152 of the membrane layer 150 is 0.76 μm to 0.9 μm. Additionally, the attenuation performance is improved in a case in which the angle of inclination θ1 of the edge of the piezoelectric layer 130 is greater than 70° as compared to the related art (the case in which the frame part is formed).

Additionally, referring to FIG. 7, even if the width w1 of the protruding portion 152 is increased, $kt^2$ characteristic is maintained to be relatively constant.

As described above, the attenuation performance may be improved and $kt^2$ characteristic may be improved by the protruding portion 152 of the membrane layer 150. That is, compared to the typical technology (i.e., the case in which the frame part is formed on the upper electrode), when the protruding portion 152 of the membrane layer 150 is formed, performance of the bulk-acoustic wave resonator 100 may be improved.

Further, since the frame part is not formed on the upper electrode 140, spurious noise may be reduced.

Figure 8:
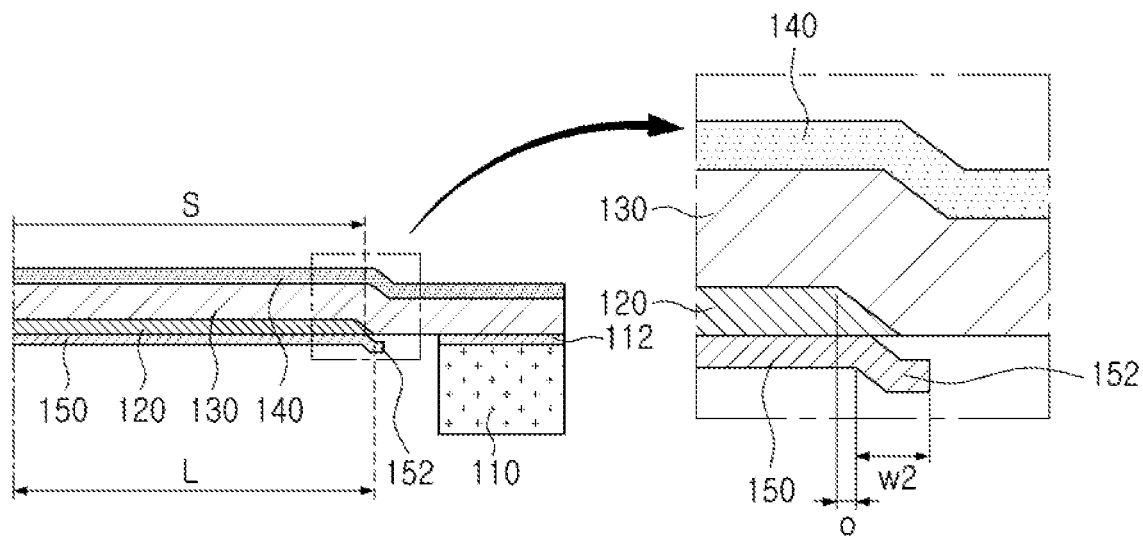
FIG. 8 is a configuration view illustrating an example of another effect of a bulk-acoustic wave resonator.
Figure 9:
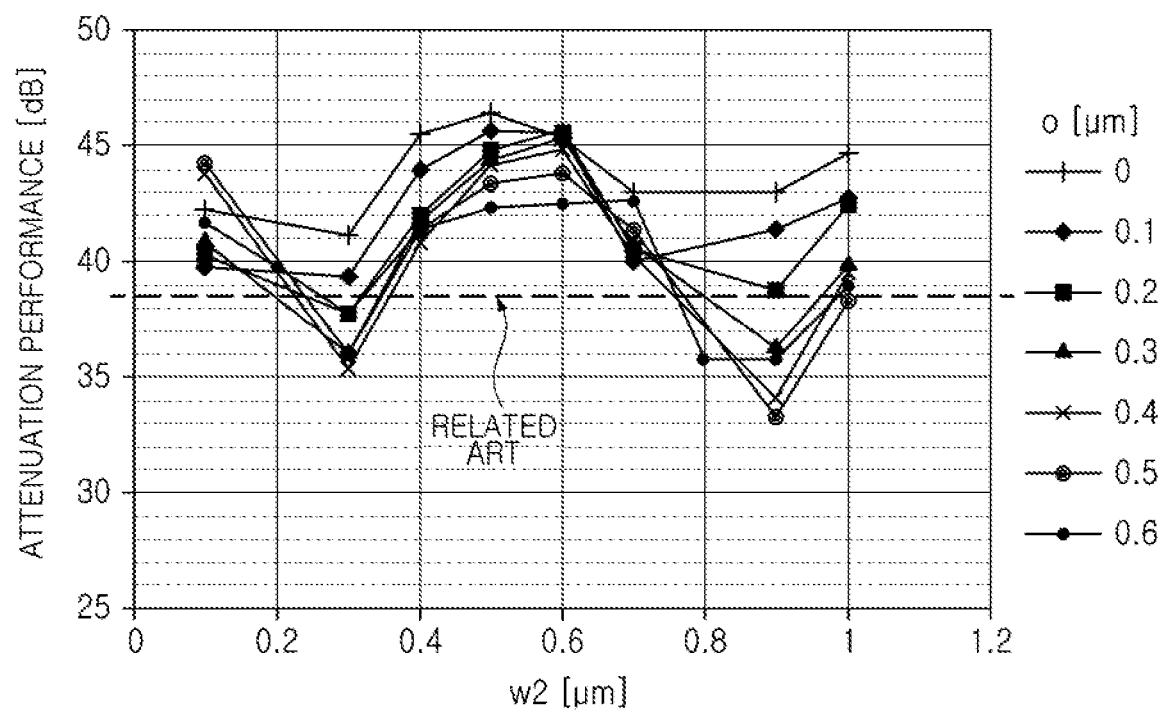
FIG. 9 is a graph illustrating an example of a change in attenuation characteristics according to a width of a protruding part of a bulk-acoustic wave resonator.

FIG. 8 is a configuration view illustrating an example of another effect of the bulk-acoustic wave resonator according to the present disclosure and FIG. 9 is a graph illustrating an example of a change in attenuation characteristics according to a width of a protruding part of the bulk-acoustic wave resonator according to the present disclosure.

Referring to FIG. 8, first, it is assumed that a distance from a start point at which the inclined surface of the lower electrode 120 is formed to a point at which the protruding portion 152 of the membrane layer 150 starts is an off-set o, and a width of the protruding portion 152 is w2.

When the attenuation characteristic is observed while changing the off-set o and the width w2 of the protruding portion 152, the attenuation characteristic is improved regardless of a distance of the off-set o in a case in which the width w2 of the protruding portion 152 is about 0.4 μm to 0.7 μm as compared to the typical technology (in the case in which the frame part is formed) as illustrated in FIG. 9.

Hereinafter, a modified example of the bulk-acoustic wave resonator will be described with reference to the drawings. However, the same components as the above-mentioned components will be denoted by the same reference numerals as those used in the above description and a detailed description thereof will be omitted.

Figure 10:
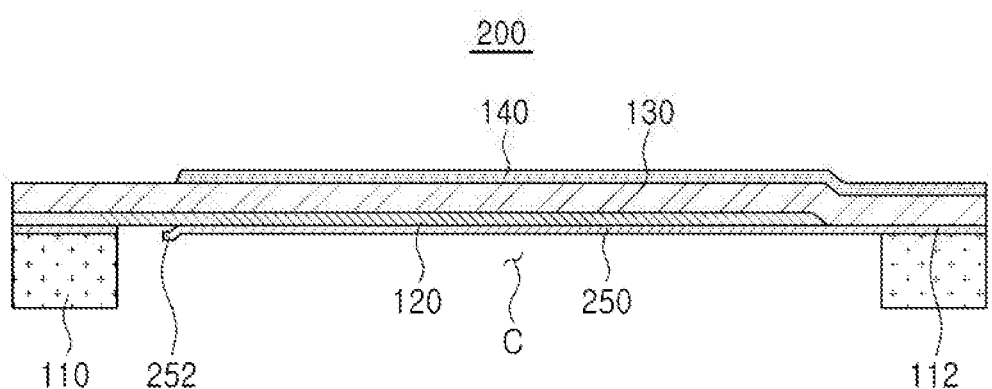
FIG. 10 is a schematic configuration view illustrating an example of a bulk-acoustic wave resonator.

FIG. 10 is a schematic configuration view illustrating an example of a bulk-acoustic wave resonator, e.g., any of the bulk wave acoustic resonators of FIGS. 1-9, according to the present disclosure.

Referring to FIG. 10, a bulk-acoustic wave resonator 200 includes a protruding part 252 of a membrane layer 250. The protruding part 252 of the membrane layer 250 is formed below a first inclined edge side of the upper electrode 140, that is, below a region (a lower electrode connecting part) extended from a portion in which the lower electrode 120 is formed on the cavity C.

Figure 11:
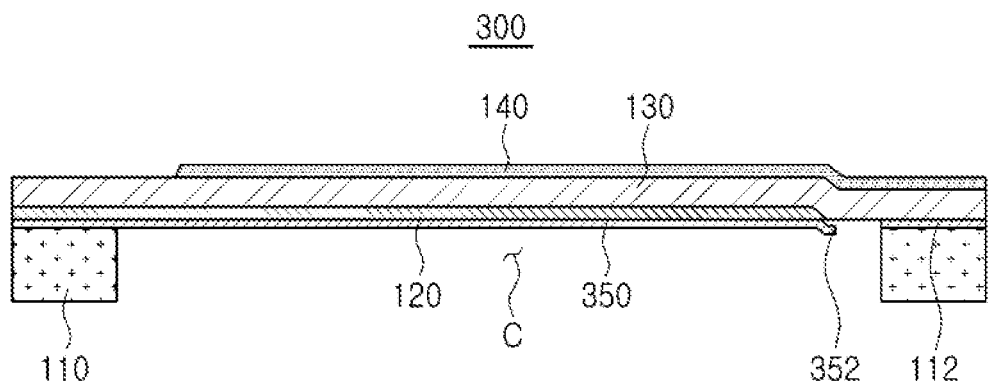
FIG. 11 is a schematic configuration view illustrating an example of a bulk-acoustic wave resonator.

FIG. 11 is a schematic configuration view illustrating an example of a bulk-acoustic wave resonator, e.g., any of the bulk wave acoustic resonators of FIGS. 1-9, according to the present disclosure.

Referring to FIG. 11, a bulk-acoustic wave resonator 300 includes a protruding part 352 of a membrane layer 350. The protruding part 352 of the membrane layer 350 is formed below an edge side of the lower electrode 120, and below a declining region of an upper electrode connecting part that extends from a horizontal portion of the upper electrode 140 that is formed on the cavity C.

Figure 12:
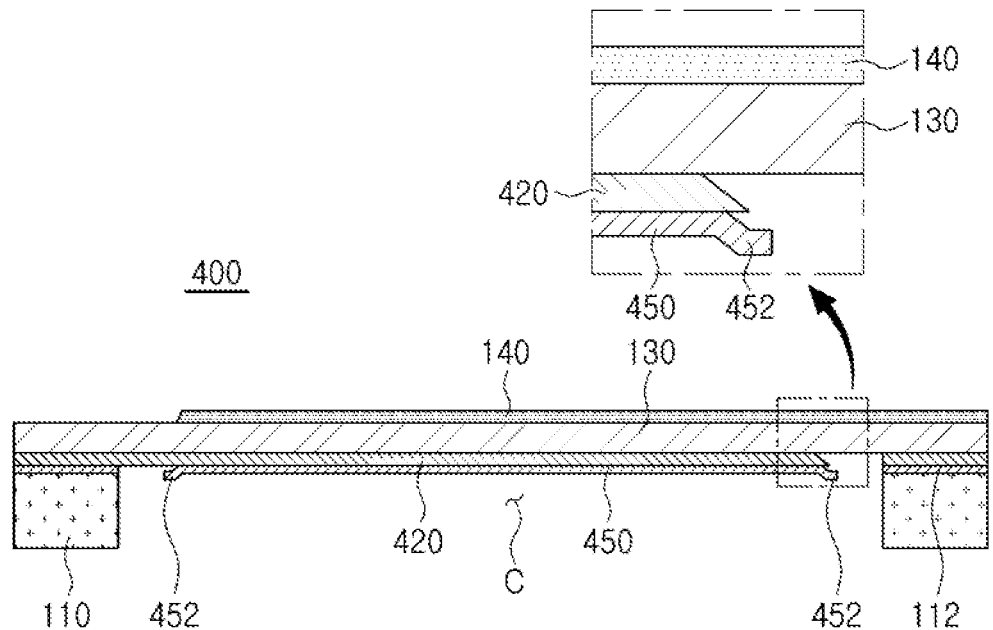
FIG. 12 is a schematic configuration view illustrating an example of a bulk-acoustic wave resonator.

FIG. 12 is a schematic configuration view illustrating an example of a bulk-acoustic wave resonator according to the present disclosure.

Referring to FIG. 12, a bulk-acoustic wave resonator 400 includes a lower electrode 420 exposed to the air and a membrane layer 450 formed below the lower electrode 420.

At least a portion of the lower electrode 420 may be exposed to the air and the membrane layer 450 may be formed below the lower electrode 420 exposed to the air. A protruding part 452 may be formed at one or more edges of the membrane layer 450. The protruding part 452 may be formed to have a first portion that inclines at about a 45° angle with respect to the membrane layer 450, and a second portion that is parallel to the membrane layer 450.

Figure 13:
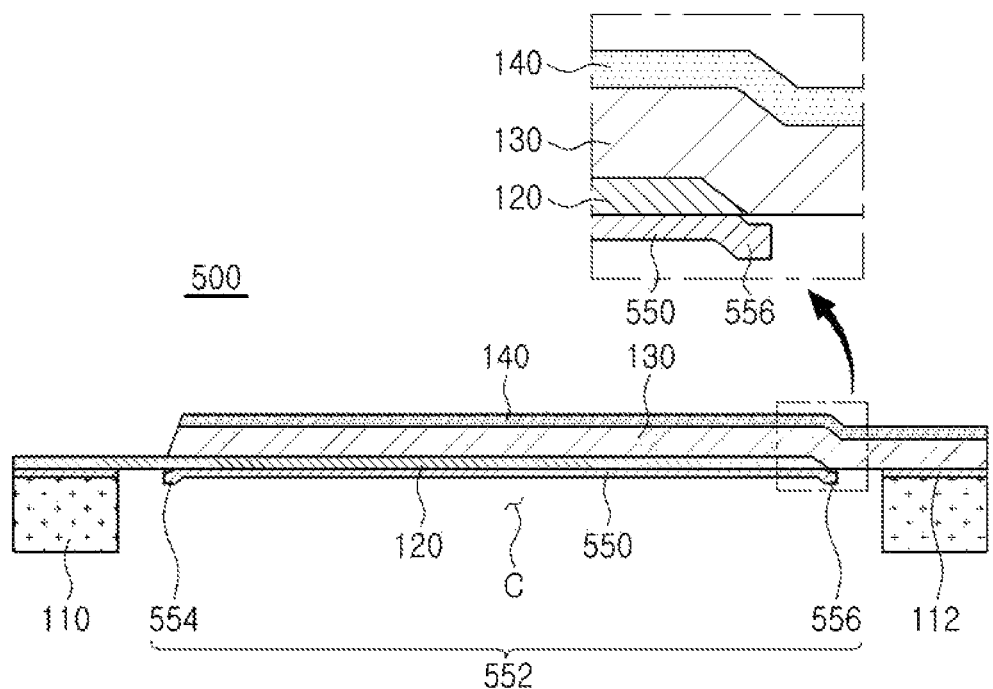
FIG. 13 is a schematic configuration view illustrating an example of a bulk-acoustic wave resonator.

FIG. 13 is a schematic configuration view illustrating another example of a bulk-acoustic wave resonator, e.g., any of the bulk wave acoustic resonators of FIGS. 1-9, according to the present disclosure.

Referring to FIG. 13, a bulk-acoustic wave resonator 500 includes a membrane layer 550 including a protruding portion 552. The protruding portion 552 may include a first protruding part 554 formed on a portion of a first edge of the membrane layer 550, and a second protruding part 556 formed on a portion of a different second edge of the protruding portion 552, e.g., on a region except for a region in which the first protruding part 554 is formed.

A thickness of each of the first protruding part 554 and the second protruding part 556 may be thicker than a thickness of a central portion of the membrane layer 550.

Figure 14:
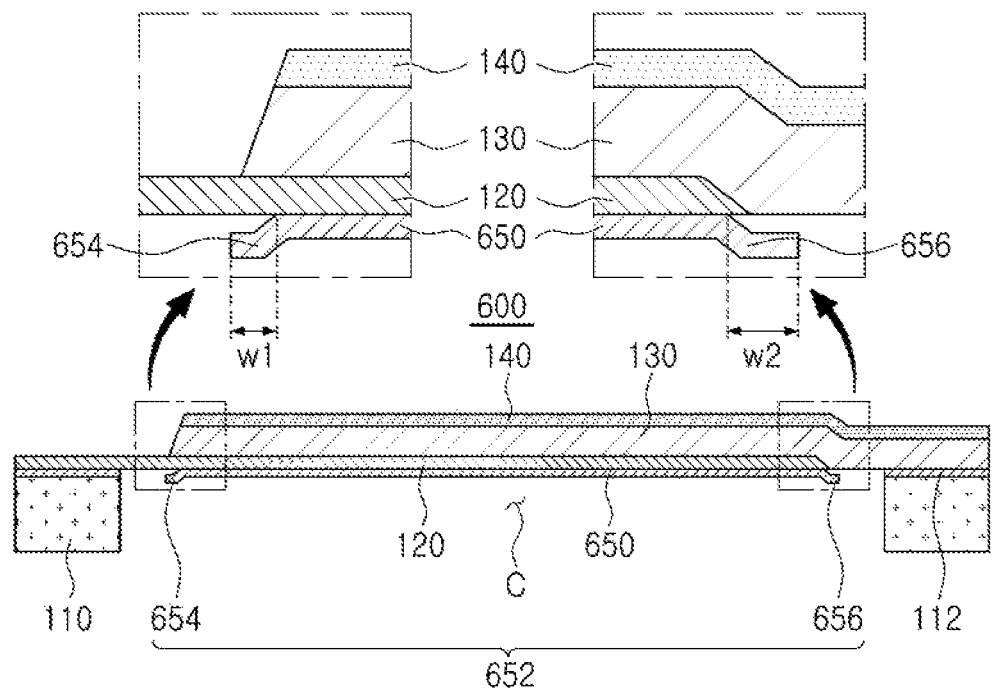
FIG. 14 is a schematic configuration view illustrating an example of a bulk-acoustic wave resonator.

FIG. 14 is a schematic configuration view illustrating an example of a bulk-acoustic wave resonator according to the present disclosure.

Referring to FIG. 14, a bulk-acoustic wave resonator 600 includes a membrane layer 650 including a protruding portion 652. The protruding portion 652 includes a first protruding part 654 formed on a portion of a first edge of the membrane layer 650, and a second protruding part 656 formed on a portion of a second edge of the protruding portion 652. The first protruding part 654 and the second protruding part 656 may each be formed to have a first portion that inclines at about a 45° angle with regard to the membrane layer 650, and a second portion that is parallel to the membrane layer 650, and that extends from the inclined first portion.

A width w1 of the first protruding part 654 and a width w2 of the second protruding part 656 may be different from each other.

Figure 15:
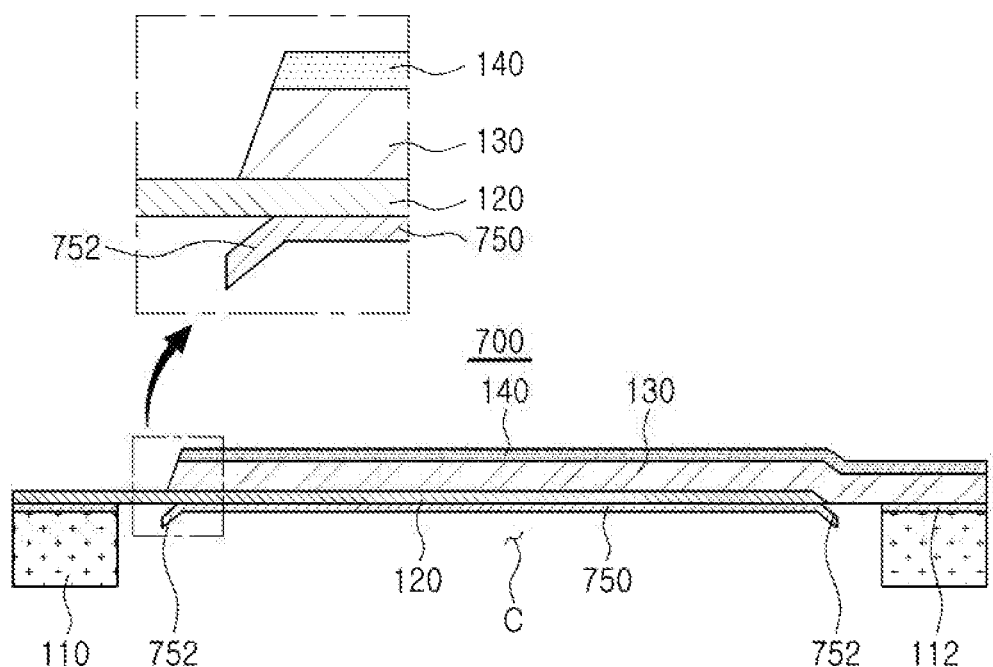
FIG. 15 is a schematic configuration view illustrating an example of a bulk-acoustic wave resonator.

FIG. 15 is a schematic configuration view illustrating another example of a bulk-acoustic wave resonator according to the present disclosure.

Referring to FIG. 15, a bulk-acoustic wave resonator 700 includes a protruding part 752 of a membrane layer 750. The protruding part 752 is formed to be inclined. That is, the protruding part 752 does not include an extended part formed to be parallel to a central portion of the membrane layer 750.

Figure 16:
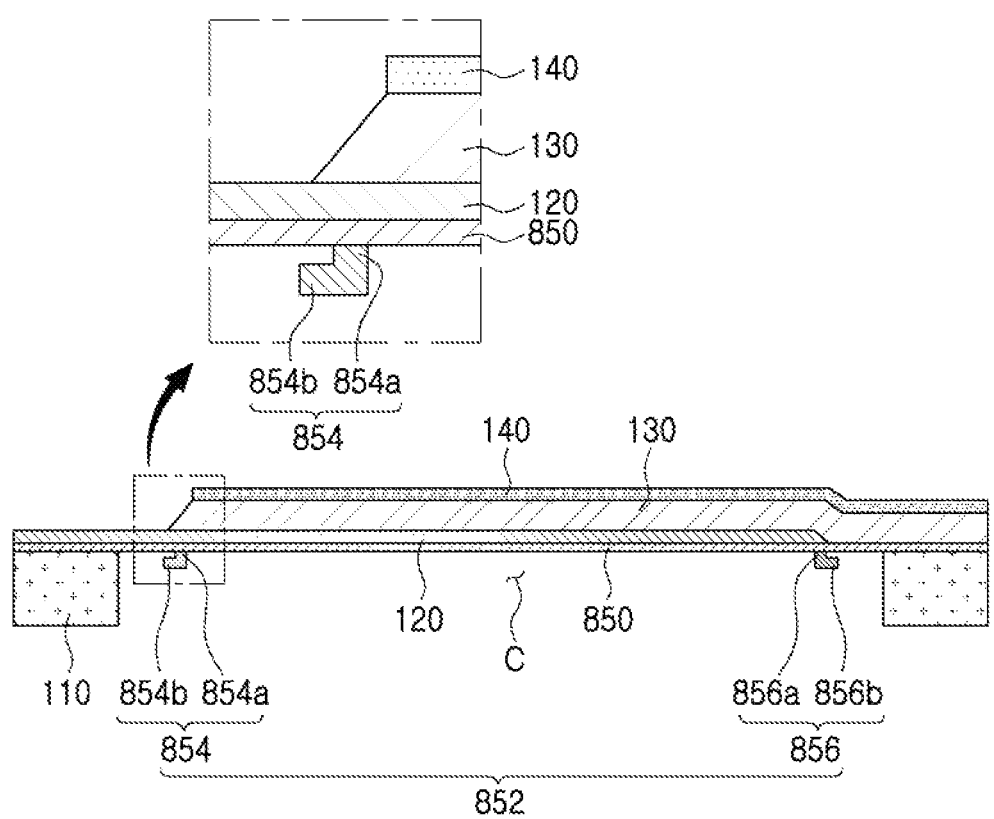
FIG. 16 is a schematic configuration view illustrating an example of a bulk-acoustic wave resonator.

FIG. 16 is a schematic configuration view illustrating another example of a bulk-acoustic wave resonator according to the present disclosure.

Referring to FIG. 16, a bulk-acoustic wave resonator 800 includes, for example, a substrate 110, a lower electrode 120, a piezoelectric layer 130, an upper electrode 140, a seed layer 850, and a protruding portion 852.

Since the substrate 110, the lower electrode 120, the piezoelectric layer 130, and the upper electrode 140 substantially correspond to the same components as those described above, a detailed description thereof will be omitted and will be replaced with the above description.

The seed layer 850 may cover the cavity C, and may be formed of, for example, a silicon nitride (SiN) material, but is not limited thereto. Since the seed layer 850 is a component that allows the lower electrode 120 to be stacked more smoothly, it may be omitted.

The protruding portion 852 may be formed to protrude toward the cavity C from a bottom surface of the seed layer 850. Additionally, the protruding portion 852 may be formed outside an active area S. The active area S refers to an area in which all of the lower electrode 120, the piezoelectric layer 130, and the upper electrode 140 are stacked.

As an example, the protruding portion 852 may include a first protruding part 854 formed outside an edge, or an end portion, of the upper electrode 140 and a second protruding part 856 formed below an edge, or an end portion, of the lower electrode 120.

Additionally, the first and second protruding parts 854 and 856 may include first extended parts 854a and 856a that extend downwardly or in a vertical direction from the seed layer 850, and second extended parts 854b and 856b that extend in a horizontal direction from the extended vertical parts 854a and 856a.

As such, the protruding portion 852 is formed, such that resonance energy may be trapped in the active area by reflecting a lateral wave into the resonator even though the frame part is not formed on the upper electrode 140 as in the related art.

Although the various examples demonstrate specific configurations of the bulk-acoustic wave resonator and provide the description through such configuration views that illustrate non-limiting examples, the bulk-acoustic wave resonators may be manufactured by any of the manufacturing method below, noting that the examples are non-limiting thereto. As noted above, and as non-limiting example, the protruding portion may be employed in the bulk-acoustic wave resonator having various shapes and structures.

For example, FIGS. 17 through 23 are process charts illustrating an example of a method for manufacturing a bulk-acoustic wave resonator according to the present disclosure. As a non-limiting example, the bulk acoustic wave resonator may correspond to any of the above bulk acoustic wave resonators.

Figure 17:
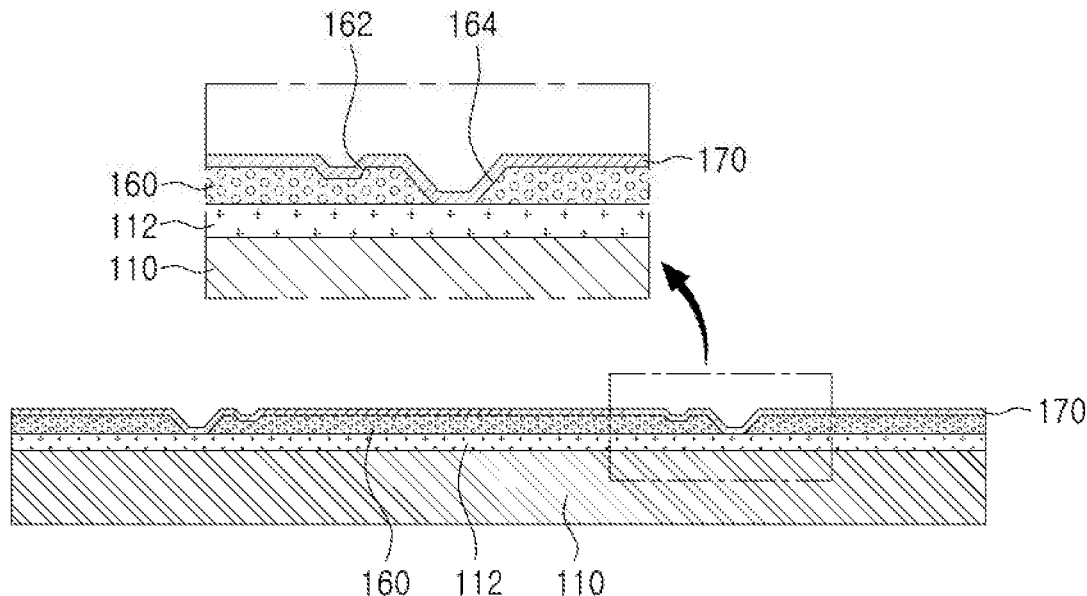
FIGS. 17 through 23 are process charts illustrating examples of methods for manufacturing a bulk-acoustic wave resonator.

First, as illustrated in FIG. 17, a first sacrificial layer 160 is formed on a substrate 110 on which a substrate protective layer 112 is formed, and first and second grooves 162 and 164 having different sizes are formed by etching the first sacrificial layer 160. Next, a membrane layer 170 is formed on the first sacrificial layer 160.

Figure 18:
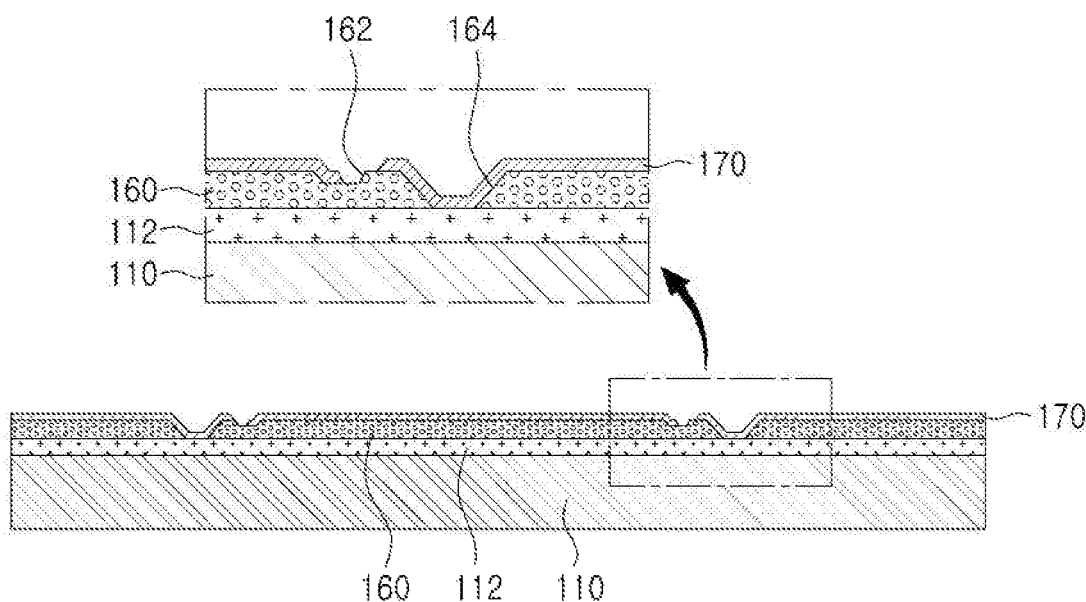

Next, as illustrated in FIG. 18, the membrane layer 170 is etched to expose a portion of the first groove 162 and a portion of a periphery of the first groove 162.

Figure 19:
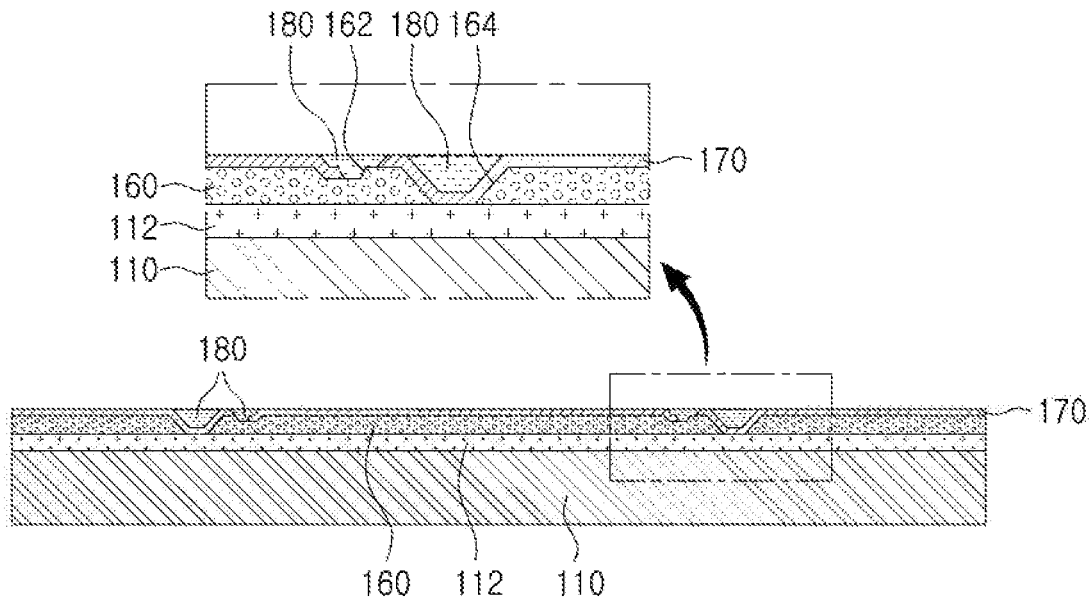

Next, as illustrated in FIG. 19, a second sacrificial layer 180 is formed.

Figure 20:
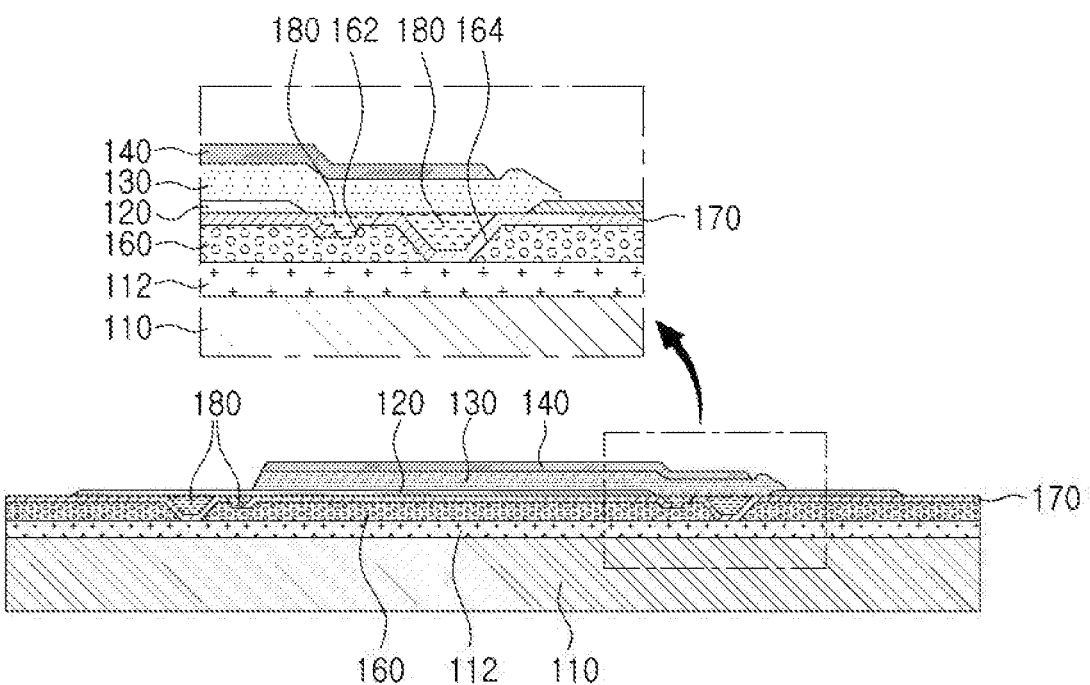
Figure 21:
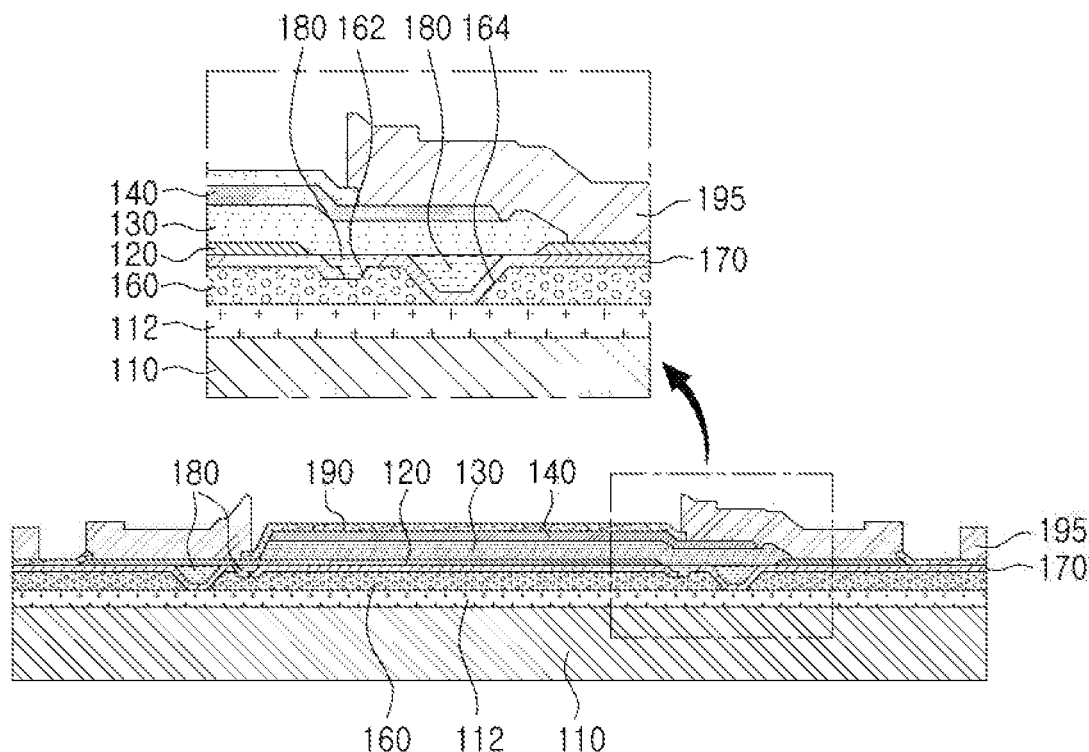

Next, as illustrated in FIGS. 20 and 21, the lower electrode 120, the piezoelectric layer 130, and the upper electrode 140 are sequentially stacked, and a passivation layer 190 and a metal pad 195 are then formed.

Figure 22:
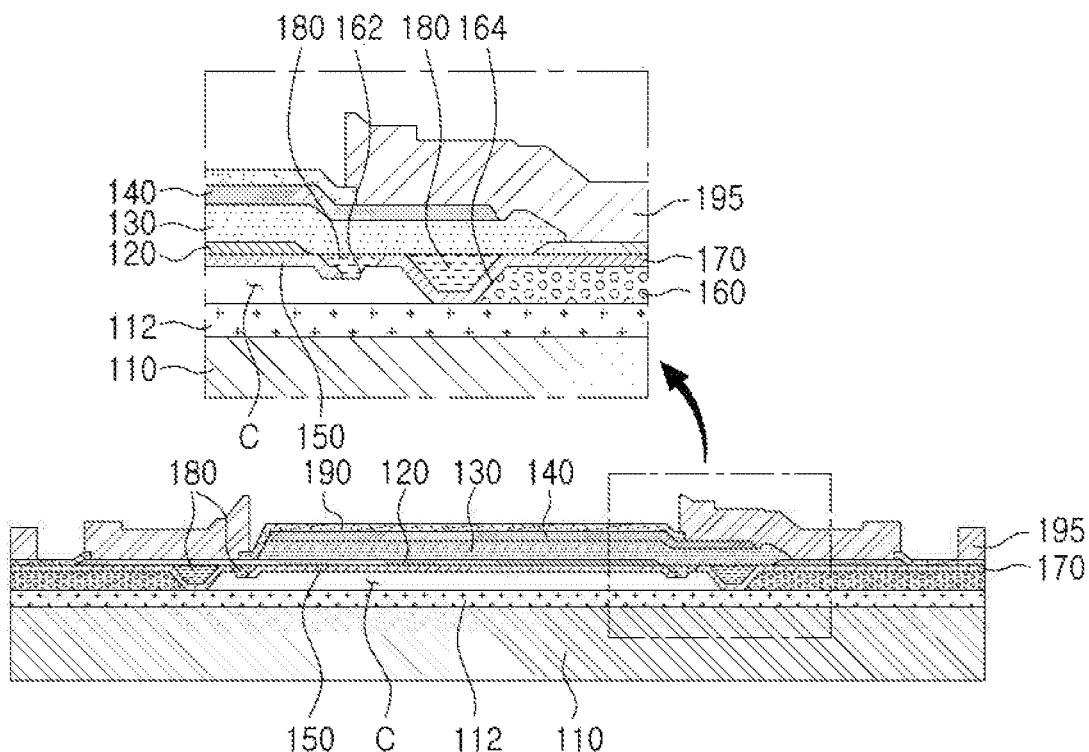

Next, as illustrated in FIG. 22, the cavity C is formed by removing the first sacrificial layer 160.

Figure 23:
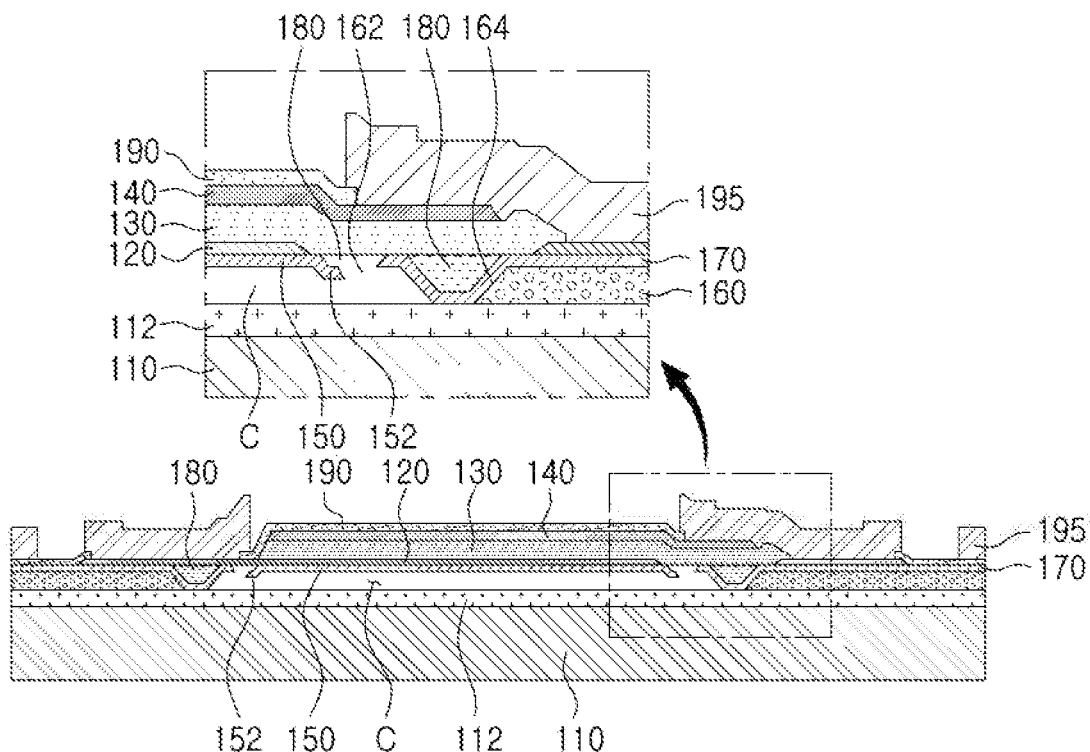

Next, as illustrated in FIG. 23, a membrane layer 150 is formed by removing the second sacrificial layer 180 formed in the first groove 162. In this case, a protruding portion 152 of the membrane layer 150 is formed by removing the second sacrificial layer 180.

FIGS. 24 through 32 are process charts illustrating an example of a method for manufacturing a bulk-acoustic wave resonator according to the present disclosure. As a non-limiting example, the bulk acoustic wave resonator may correspond to any of the above bulk acoustic wave resonators.

Figure 24:
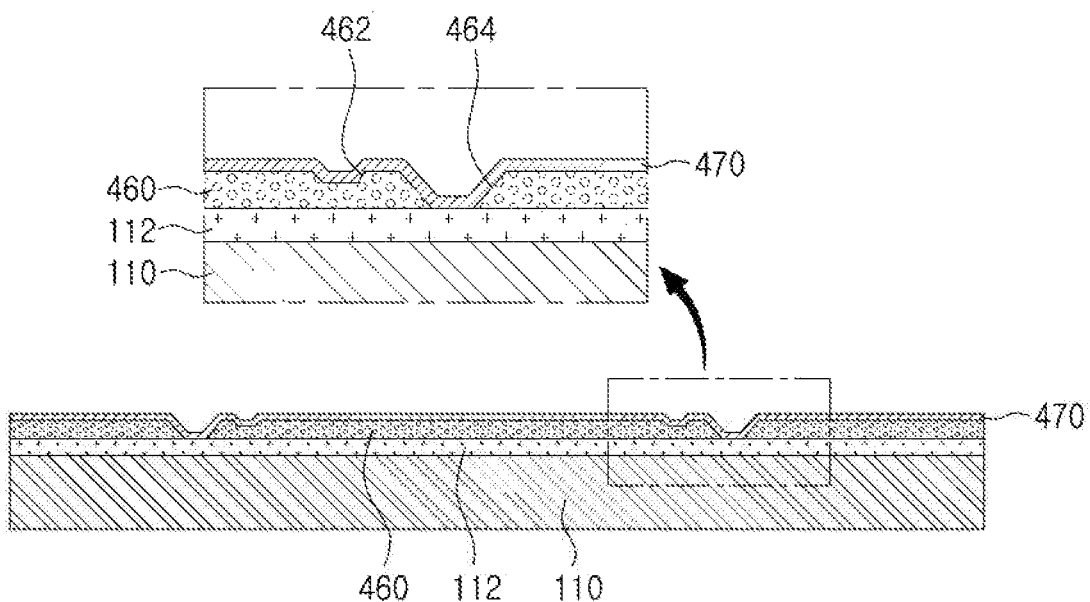
FIGS. 24 through 32 are process charts illustrating examples of methods for manufacturing a bulk-acoustic wave resonator.

First, as illustrated in FIG. 24, a first sacrificial layer 460 is formed on the substrate 110 on which the substrate protective layer 112 is formed, and first and second grooves 462 and 464 having different sizes are formed by etching the first sacrificial layer 460. Next, a membrane layer 470 is formed on the first sacrificial layer 460.

Figure 25:
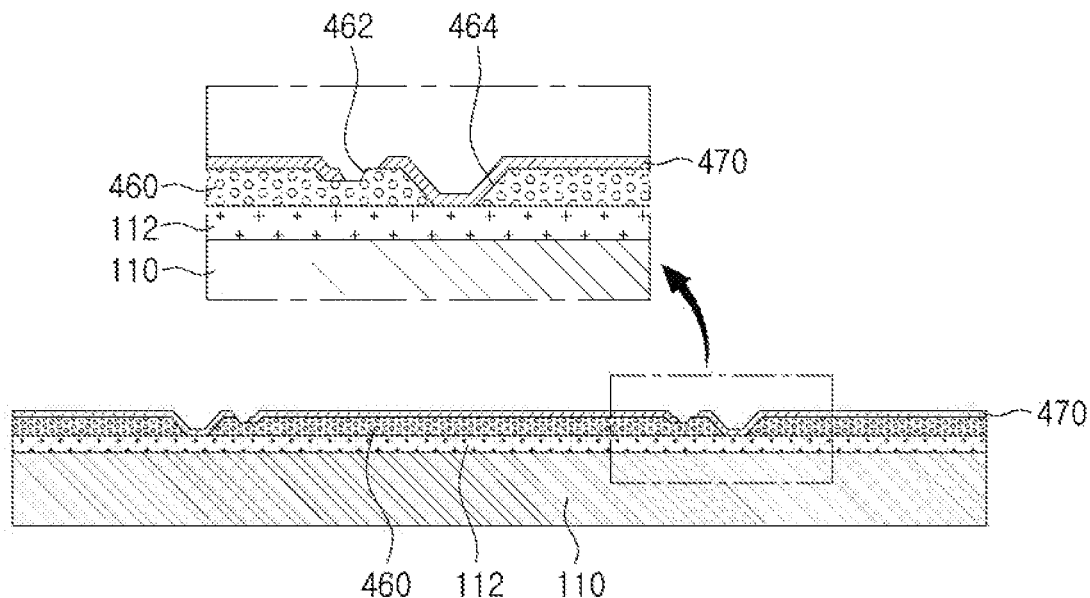

Next, as illustrated in FIG. 25, the membrane layer 470 is etched to expose a portion of the first groove 462 and a portion of a periphery of the first groove 462.

Figure 26:
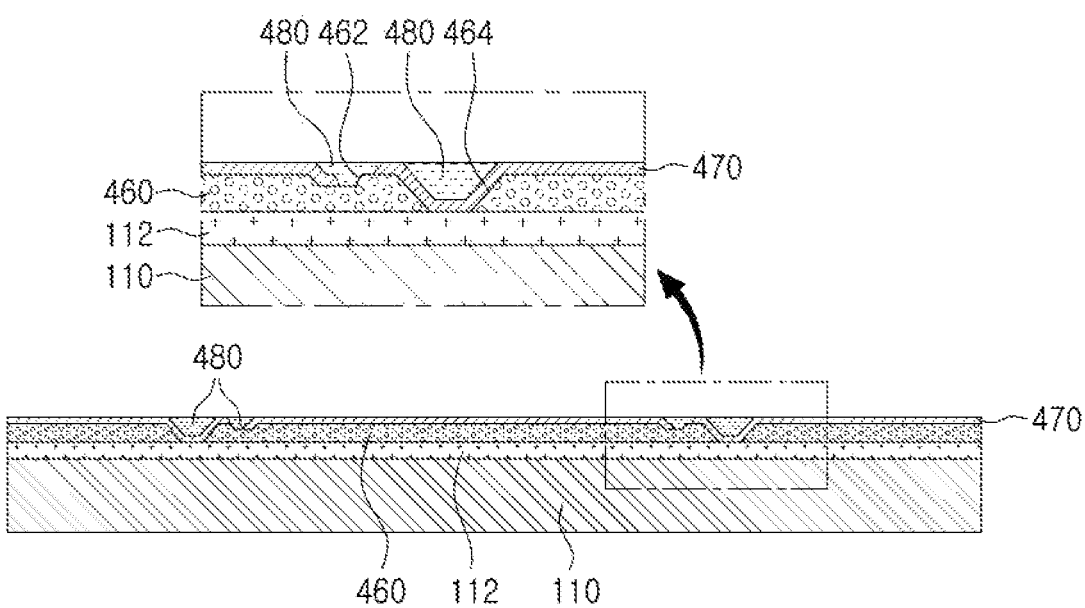

Next, as illustrated in FIG. 26, a second sacrificial layer 480 is formed.

Figure 27:
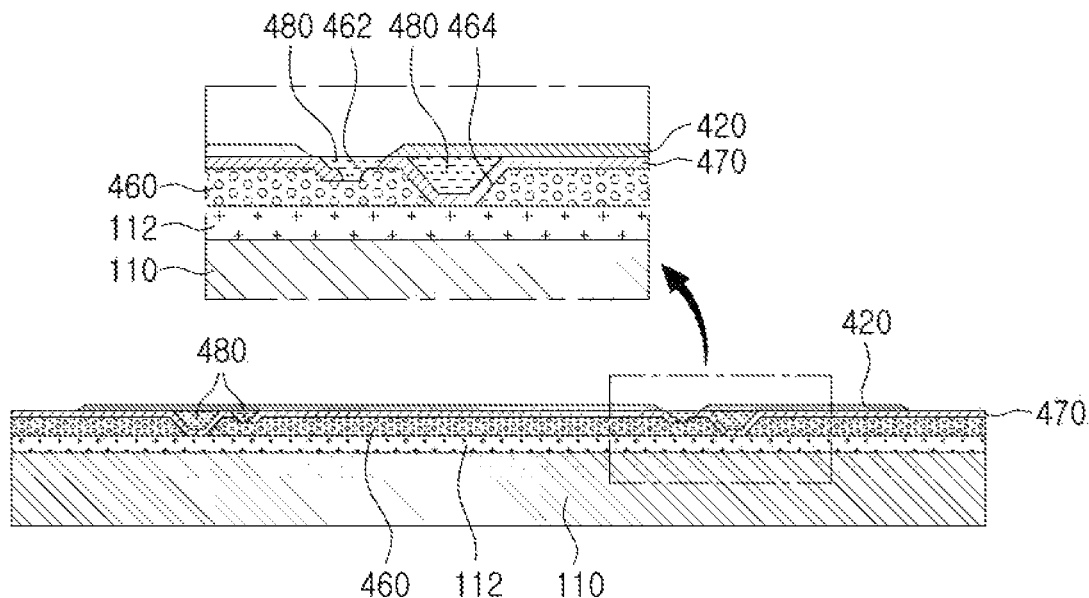

Next, as illustrated in FIG. 27, a lower electrode 420 is stacked, and the lower electrode 420 formed on the second sacrificial layer 480 is removed by etching.

Figure 28:
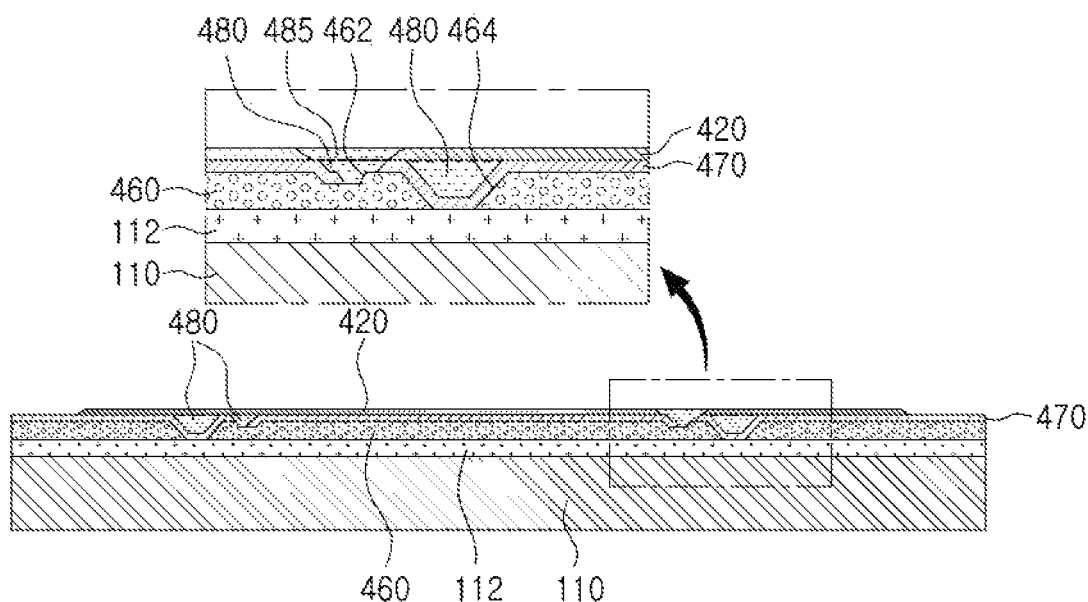

Additionally, as illustrated in FIG. 28, a third sacrificial layer 485 is formed on the second sacrificial layer 480, which is a portion from which the lower electrode 420 is removed. The third sacrificial layer 485 may be formed of the same material as the second sacrificial layer 480, but is not limited thereto.

Figure 29:
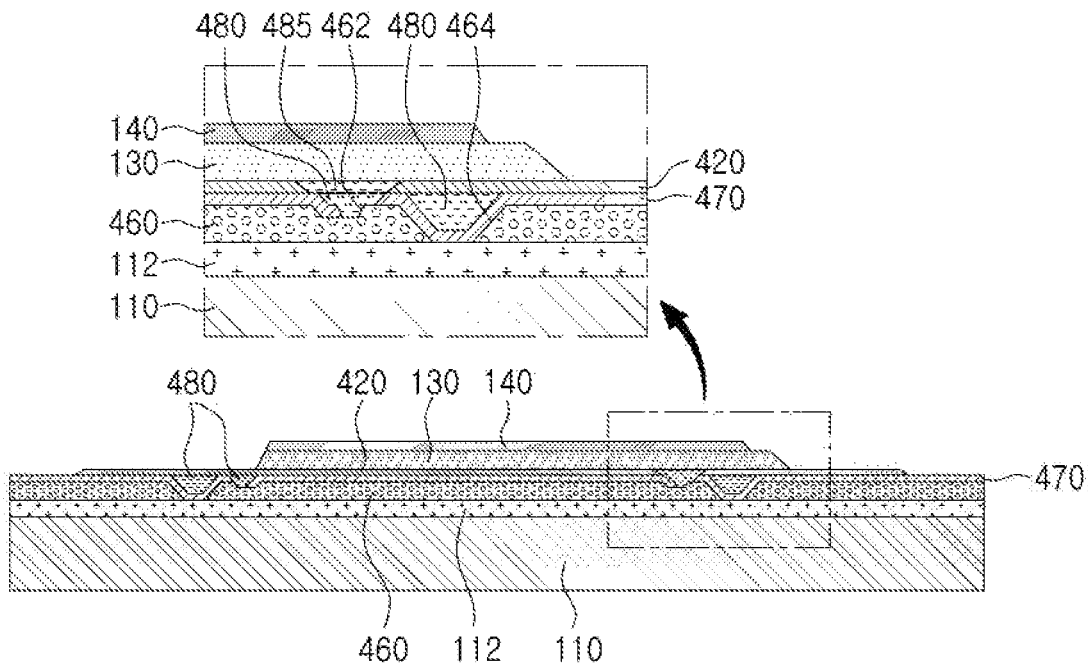

Next, as illustrated in FIG. 29, a piezoelectric layer 130 and an upper electrode 140 is sequentially stacked.

Figure 30:
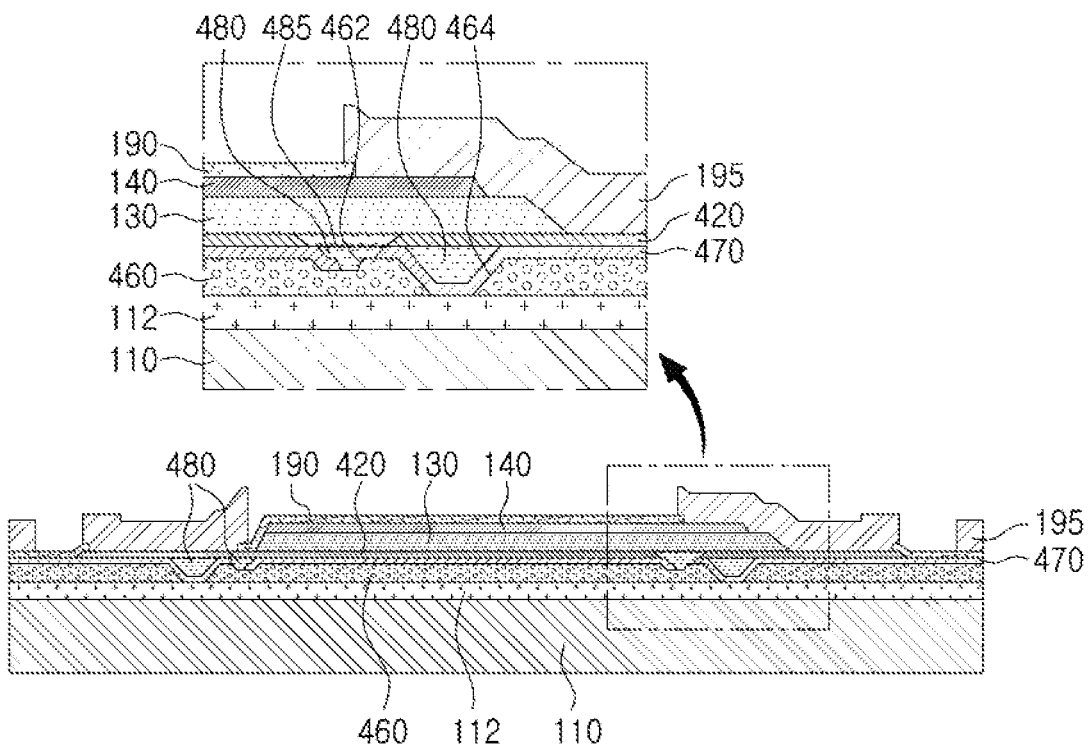

Next, as illustrated in FIG. 30, a passivation layer 190 and a metal pad 195 are formed.

Figure 31:
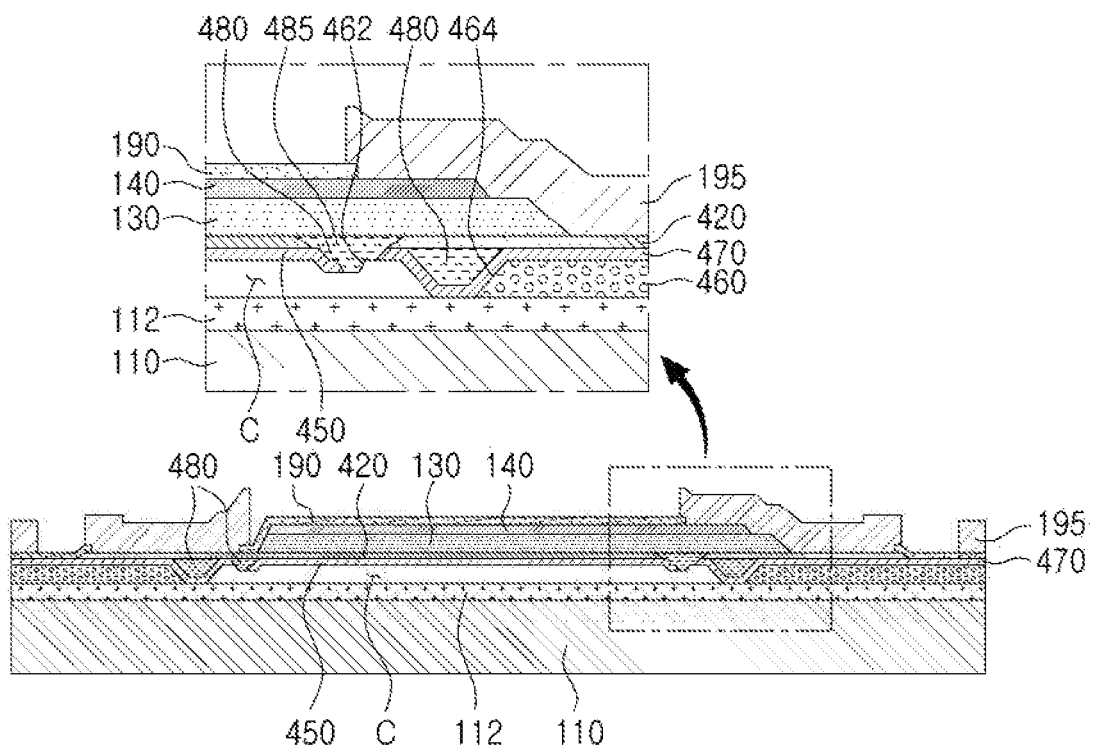

Next, as illustrated in FIG. 31, the cavity C is formed by removing the first sacrificial layer 460.

Figure 32:
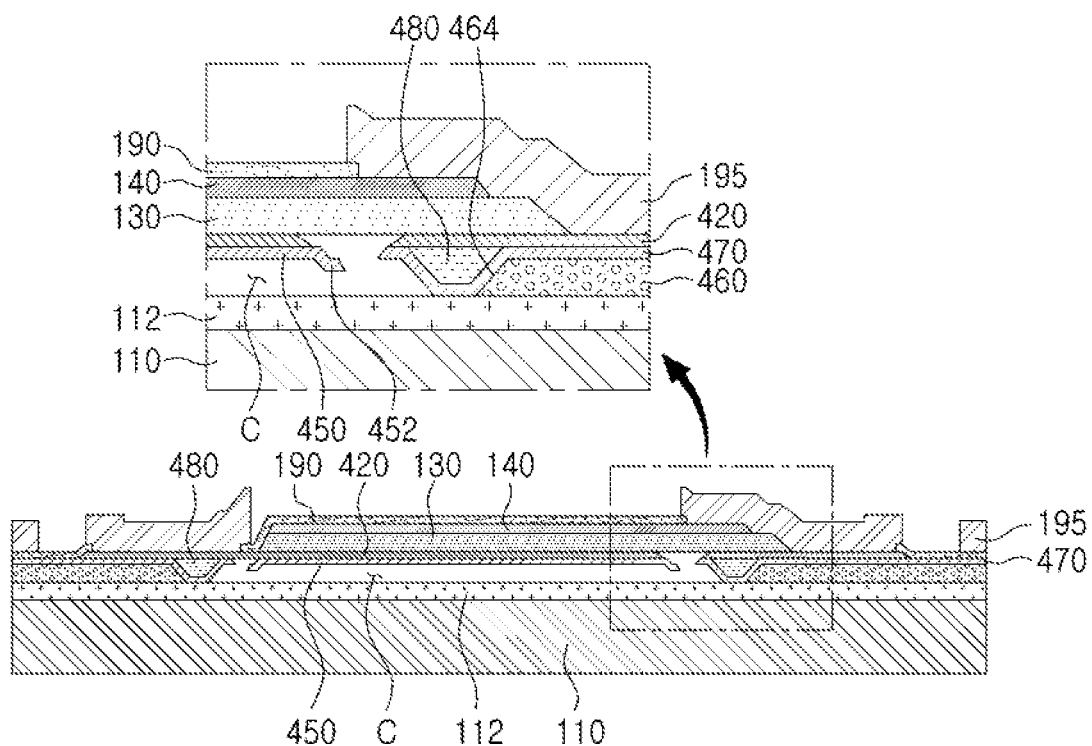

Next, as illustrated in FIG. 32, the second sacrificial layer 480 formed in the first groove 462 and the third sacrificial layer 485 stacked on the second sacrificial layer 480 are simultaneously removed to form the membrane layer 450 and to expose a portion of the lower electrode 420 to the air. In this case, a protruding part 452 of the membrane layer 450 is formed by removing the second sacrificial layer 480.

FIGS. 33 through 40 are examples of process charts illustrating a method for manufacturing a bulk-acoustic wave resonator according to the present disclosure. As a non-limiting example, the bulk acoustic wave resonator may correspond to any of the above bulk acoustic wave resonators.

Figure 33:
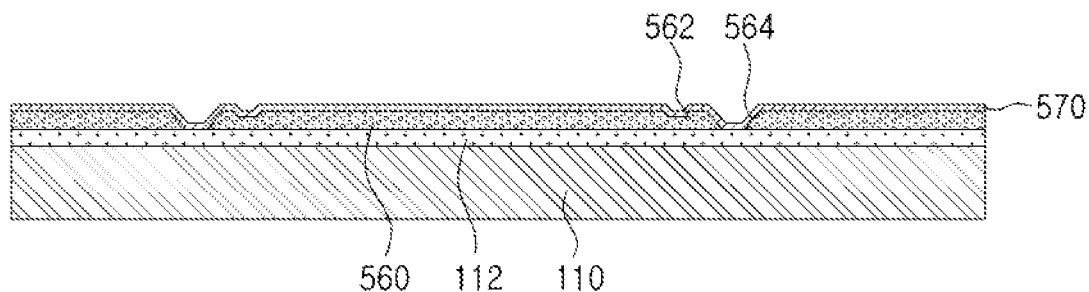
FIGS. 33 through 40 are process charts illustrating examples of methods for manufacturing a bulk-acoustic wave resonator.

First, as illustrated in FIG. 33, a first sacrificial layer 560 is formed on the substrate 110 on which the substrate protective layer 112 is formed, and first and second grooves 562 and 464 having different sizes are formed by etching the first sacrificial layer 560. Next, a membrane layer 570 is formed on the first sacrificial layer 560.

Figure 34:
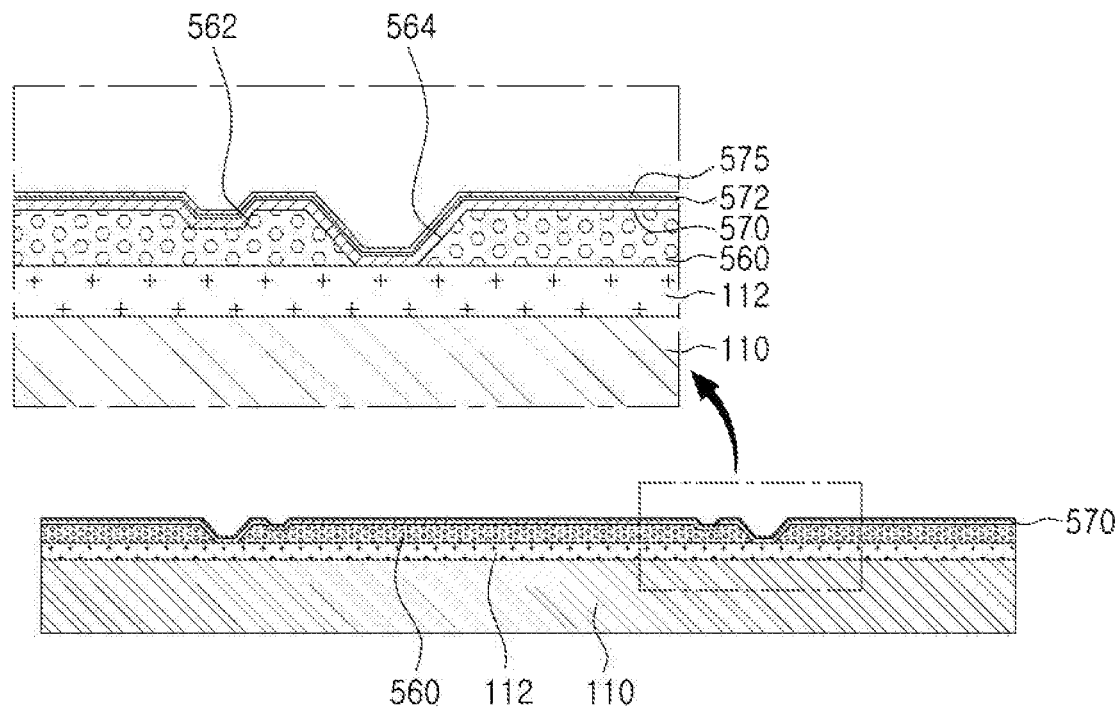

Next, as illustrated in FIG. 34, a polishing stop layer 572 is stacked on the first membrane layer 570 and a second membrane layer 575 is then formed on the polishing stop layer 572.

Figure 35:
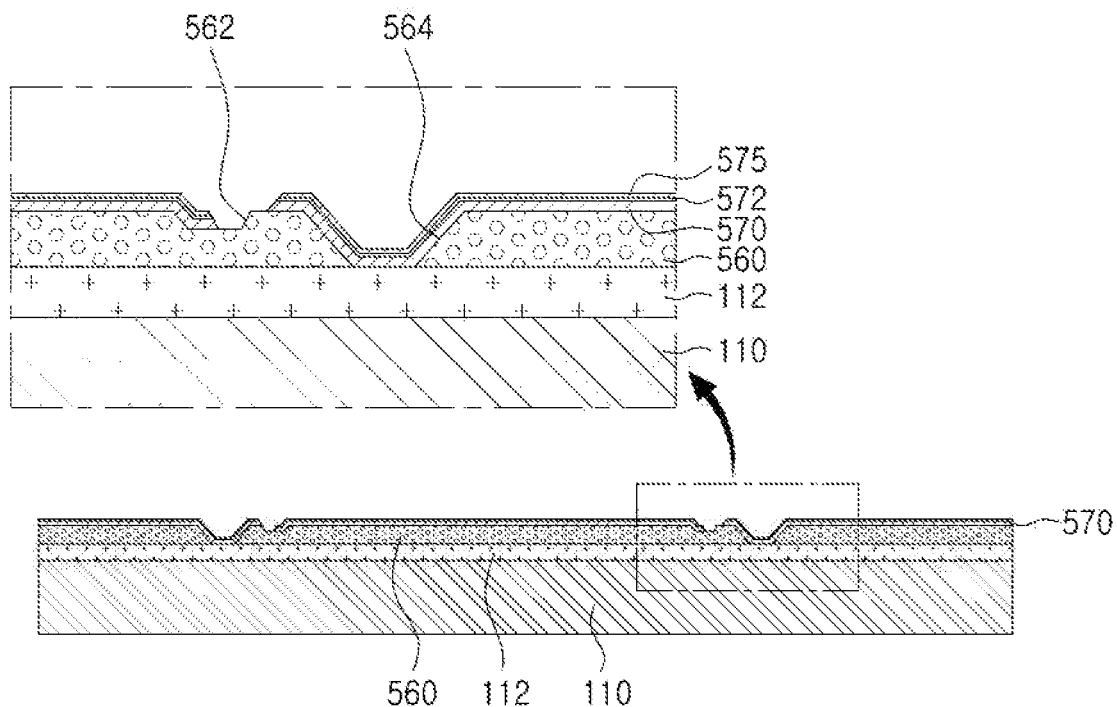

Next, as illustrated in FIG. 35, the first membrane layer 570, the polishing stop layer 572, and the second membrane layer 575 are etched to expose a portion of the first groove 562 and a portion of a periphery of the first groove 562.

Figure 36:
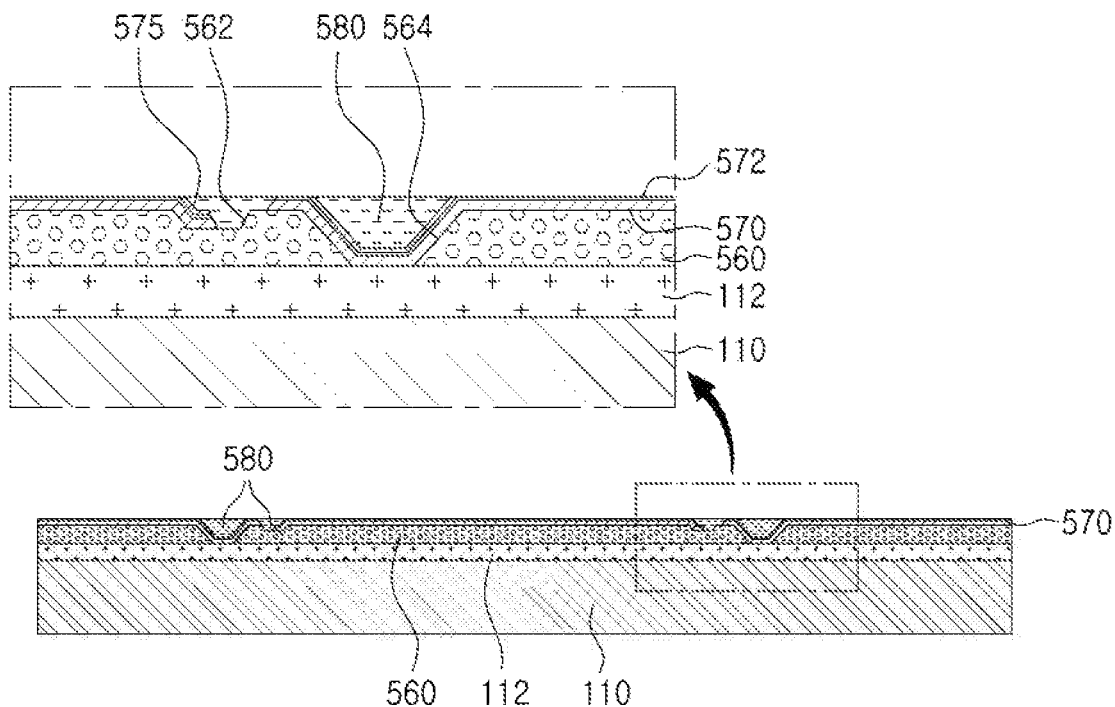

Next, as illustrated in FIG. 36, a second sacrificial layer 580 is formed. Next, the remaining second membrane layer 575 is removed by a planarization process except for the second membrane layer 575 formed in the first groove 562 and on the first groove 562.

Figure 37:
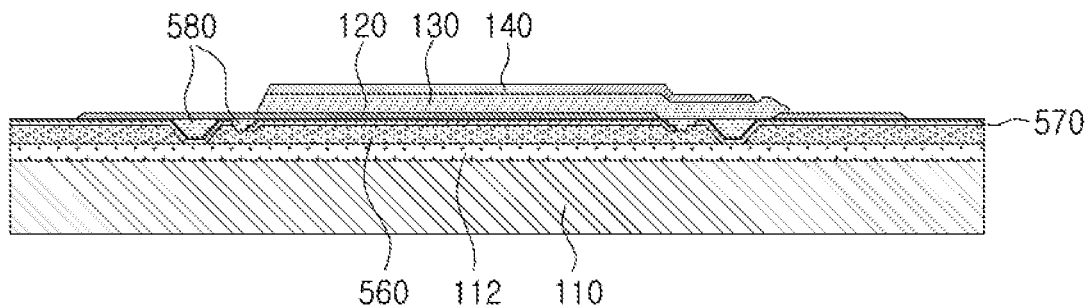

Next, as illustrated in FIG. 37, the lower electrode 120, the piezoelectric layer 130, and an upper electrode 140 are sequentially stacked.

Figure 38:
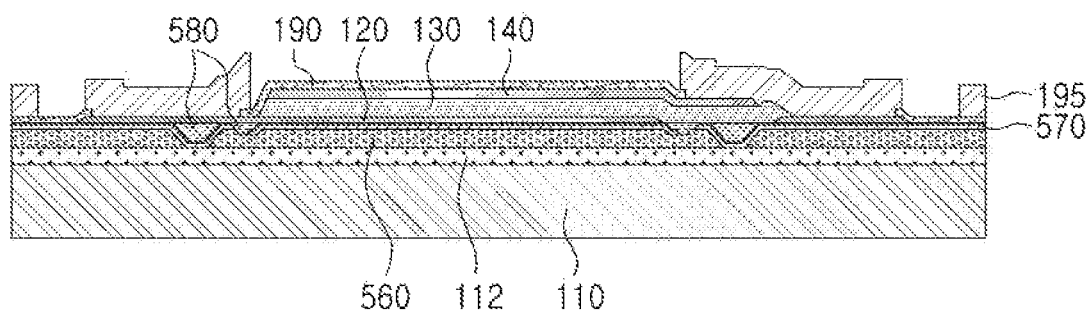

Next, as illustrated in FIG. 38, a passivation layer 190 and a metal pad 195 are formed.

Figure 39:
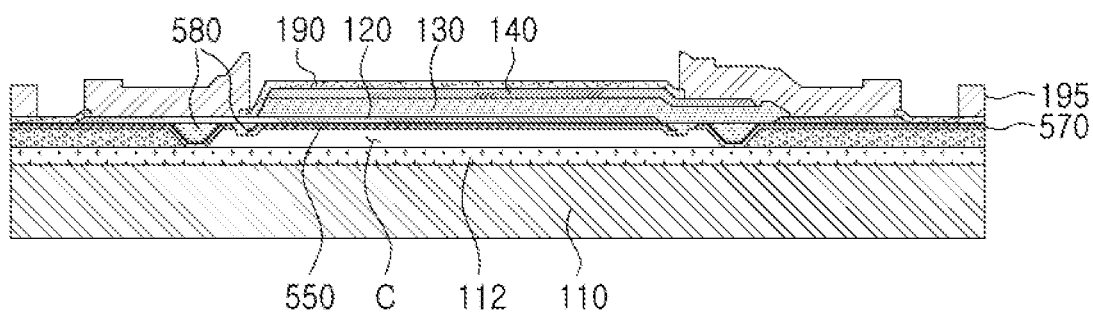

Next, as illustrated in FIG. 39, the cavity C is formed by removing the first sacrificial layer 560.

Figure 40:
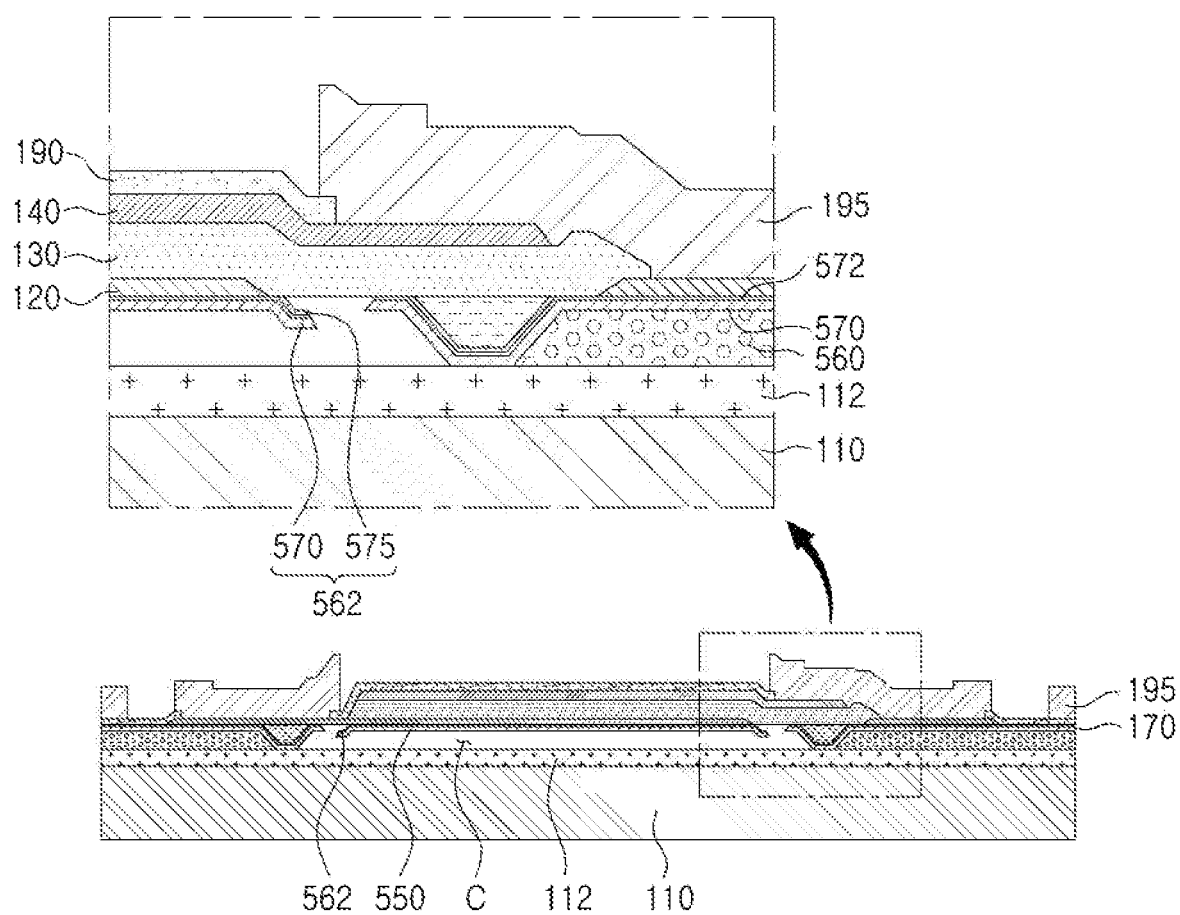

Next, as illustrated in FIG. 40, the second sacrificial layer 580 is removed. Accordingly, since a protruding part 552 is formed at the membrane layer 550 and the protruding part 552 includes the first and second membrane layers 570 and 575, the protruding part 552 may have a thickness thicker than the central portion of the membrane layer 550 including the first membrane layer 570.

As set forth above, according to the examples set forth in the present disclosure, since an unintended resonance may not occur in a frequency domain lower than a resonance frequency of the active area, the interference in the waveform of the adjacent filter band may be reduced.

Additionally, in the examples, some characteristics ($Kt^2$ characteristic) may be maintained by improving Q performance and attenuation performance without narrowing the area of the active area.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator comprising:
 a substrate;
 a lower electrode disposed on the substrate, and at least a portion of the lower electrode is disposed on a cavity;
 a piezoelectric layer disposed on the lower electrode;
 an upper electrode disposed on the piezoelectric layer;
 a membrane layer disposed below the lower electrode and forming the cavity together with the substrate; and
 a protruding portion formed on the membrane layer and formed into the cavity in a direction that extends away from the membrane layer.

2. The bulk-acoustic wave resonator of claim 1, wherein the protruding portion comprises a first protruding part formed below a first edge of the upper electrode and a second protruding part formed below a first edge of the lower electrode.

3. The bulk-acoustic wave resonator of claim 2, wherein the first protruding part comprises a first inclined part inclined to be spaced apart from the lower electrode and a first extended part formed to be parallel to a central portion of the membrane layer and extending from the first inclined part, and
 the second protruding part comprises a second inclined part inclined to be spaced apart from the lower electrode and a second extended part formed to be parallel to the central portion of the membrane layer and extending from the second inclined part.

4. The bulk-acoustic wave resonator of claim 3, wherein a thickness of at least one of a combination of the first inclined part and the second inclined part, and a combination of the first extended part and the second extended part is thicker than a thickness of the central portion of the membrane layer.

5. The bulk-acoustic wave resonator of claim 4, wherein the protruding portion comprises a first membrane layer and a second membrane layer stacked on the first membrane layer.

6. The bulk-acoustic wave resonator of claim 1, wherein the protruding portion is created by removing a plurality of sacrificial layers.

7. The bulk-acoustic wave resonator of claim 3, wherein the first protruding part and the second protruding part have different widths.

8. The bulk-acoustic wave resonator of claim 1, wherein the protruding portion is inclined.

9. The bulk-acoustic wave resonator of claim 1, wherein the protruding portion is formed below an edge of the upper electrode.

10. The bulk-acoustic wave resonator of claim 1, wherein the protruding portion is formed below an edge of the lower electrode.

11. The bulk-acoustic wave resonator of claim 1, wherein the lower electrode is formed below the piezoelectric layer, and a side surface of the lower electrode is exposed to the cavity.

12. The bulk-acoustic wave resonator of claim 1, further comprising:
 a passivation layer stacked on the upper electrode and on a first portion of the lower electrode, and
 a metal pad stacked on the upper electrode and on a second portion of the lower electrode on which the passivation layer is not formed.

13. The bulk-acoustic wave resonator of claim 1, wherein the cavity is between the substrate and the membrane layer.

14. A bulk-acoustic wave resonator comprising:
 a substrate;
 a seed layer, the substrate and the seed layer forming a cavity;

a lower electrode formed on the substrate, and at least a portion of the lower electrode is formed on the cavity;
a piezoelectric layer formed on the lower electrode;
an upper electrode formed on the piezoelectric layer; and
a protruding portion extended from the seed layer and formed in the cavity to face away from the seed layer.

15. The bulk-acoustic wave resonator of claim 14, wherein the protruding portion comprises a first protruding part formed below a first edge of the upper electrode and a second protruding part formed below a first edge of the lower electrode, and
the first protruding part and the second protruding part comprise first parts that extend in a vertical direction from the seed layer and second parts that extend in a horizontal direction from the first parts.

16. A bulk-acoustic wave resonator comprising:
a substrate;
a lower electrode formed on the substrate;
a piezoelectric layer formed on the lower electrode;
an upper electrode formed on the piezoelectric layer;
a membrane layer formed below the lower electrode and configured to form a cavity with the substrate; and
a protruding portion formed on one or more ends of the membrane layer.

17. The bulk-acoustic wave resonator of claim 16, wherein the protruding portion comprises a first protruding part that extends away from a first portion of the membrane layer, and a second protruding part that extends away from a second portion of the membrane layer.

18. The bulk-acoustic wave resonator of claim 17, wherein the first protruding part comprises a first extended part that extends away from the membrane layer, and a first horizontal part that extends from the first extended part, and
the second protruding part comprises a second extended part that extends away from the membrane layer, and a second horizontal part that extends from the second extended part.

19. The bulk-acoustic wave resonator of claim 16, wherein the protruding portion is formed outside of an active area of the resonator.

20. The bulk-acoustic wave resonator of claim 19, wherein the active area is an area where the lower electrode, the piezoelectric layer and the upper electrode are stacked.

21. The bulk-acoustic resonator of claim 17, wherein the first protruding part is formed below an edge of the upper electrode, and the second protruding part is formed below an edge of the lower electrode.

* * * * *